US012765033B2

(12) United States Patent
Tamura

(10) Patent No.: US 12,765,033 B2
(45) Date of Patent: Oct. 13, 2026

(54) SWITCHING ELEMENT AND SEMICONDUCTOR DEVICE

(71) Applicant: ROHM CO., LTD., Kyoto (JP)

(72) Inventor: Yuya Tamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 403 days.

(21) Appl. No.: 18/482,597

(22) Filed: Oct. 6, 2023

(65) Prior Publication Data

US 2024/0128338 A1 Apr. 18, 2024

(30) Foreign Application Priority Data

Oct. 14, 2022 (JP) ................................ 2022-165571

(51) Int. Cl.

*H01L 29/417* (2006.01)
*H01L 29/20* (2006.01)
(Continued)

(52) U.S. Cl.

CPC ....... *H10D 64/256* (2025.01); *H10D 30/4755* (2025.01); *H10D 62/8503* (2025.01); *H10D 64/513* (2025.01)

(58) Field of Classification Search

CPC .... H10D 64/256; H10D 30/673; H10D 64/23; H10D 64/513; H10D 64/27; H10D 64/111; H10D 64/00; H10D 64/257; H10D 30/4755; H10D 30/47; H10D 30/475; H10D 30/015; H10D 30/01; H10D 30/473; H10D 62/8503; H10D 62/85; H10D 62/124; H10D 62/10; H10D 62/343; H10D 62/17; H01L 23/3107; H01L 23/31; H01L 23/3135; H01L 23/3171; H01L 23/3185; H01L 23/4824; H01L 23/00; H01L 23/482; H01L 23/3128; H01L 23/481; H01L 23/48; H01L 24/49; H01L 24/05; H01L 24/73; H01L 24/37; H01L 2224/0603; H01L 2224/48; H01L 2224/040034; H01L 2224/03614; H10W 72/926; H10W 72/90;
(Continued)

(56) References Cited

U.S. PATENT DOCUMENTS 8,466,494 B2 * 6/2013 Tamari .................. H04B 1/006
257/192
2012/0211802 A1 * 8/2012 Tamari ................. H10D 64/257
257/E29.246

(Continued)

FOREIGN PATENT DOCUMENTS

JP 2013222905 A 10/2013
JP 2022118383 A 8/2022
WO 2022103732 A1 5/2022

OTHER PUBLICATIONS

Office Action issued in Japanese counterpart application No. 2022-165571, issued on May 12, 2026, with English translation.

*Primary Examiner* — Nikolay K Yushin
(74) *Attorney, Agent, or Firm* — HSML P.C.

(57) ABSTRACT

The present disclosure provides a semiconductor element, which is a switching element. The switching element includes an element front surface on which a gate pad, a plurality of drain pads, and a plurality of source pads are disposed. A source area which is the total area of the plurality of source pads, is larger than a drain area, which is the total area of the plurality of drain pads.

15 Claims, 25 Drawing Sheets

(51) Int. Cl.
*H10D 30/47* (2025.01)
*H10D 62/85* (2025.01)
*H10D 64/23* (2025.01)
*H10D 64/27* (2025.01)

(58) Field of Classification Search
CPC ... H10W 72/50; H10W 20/484; H10W 20/40; H10W 20/20; H10W 74/111; H10W 74/10; H10W 74/141; H10W 74/121; H10W 74/137; H10W 74/134; H10W 74/117
See application file for complete search history.

(56) References Cited

U.S. PATENT DOCUMENTS

2013/0292689 A1 11/2013 Ju et al.
2021/0384340 A1* 12/2021 Ozaki .................. H10D 30/015

* cited by examiner

SWITCHING ELEMENT AND SEMICONDUCTOR DEVICE

TECHNICAL FIELD

The present disclosure relates to a switching element and a semiconductor device.

BACKGROUND

A known semiconductor device includes: a semiconductor element having an element front surface on which gate pads, drain pads and source pads are formed; gate terminals, drain terminals and source terminals connected to the pads of the semiconductor element; and a sealing resin sealing the semiconductor element and the terminals (for example, refer to patent document 1).

PRIOR ART DOCUMENT

Patent Publication

[Patent document 1]: Japan Patent Publication No. 2022-118383

DETAILED DESCRIPTION OF THE EMBODIMENTS

Details of several embodiments of a switching element and a semiconductor device of the present disclosure are given with reference to the accompanying drawings below. To keep the description clear and simple, the constituting elements shown in the accompanying drawings are not necessarily drawn to fixed scales. Moreover, for better understanding, shading lines are sometimes omitted from the cross-sectional diagrams. It should be noted that the accompanying drawings are merely for illustrating the embodiments of the present disclosure, and are not to be construed as limitations to the present disclosure.

The description below includes details of a device, a system and a method for substantively implementing the illustrative embodiments of the present disclosure. The detailed description is intended for illustration purposes and is not to be construed as limitations to the embodiments of the present disclosure or applications and uses of the embodiments.

First Embodiment

Referring to FIG. 1 to FIG. 8, a semiconductor device 10 according to the first embodiment is described below.

Figure 1:
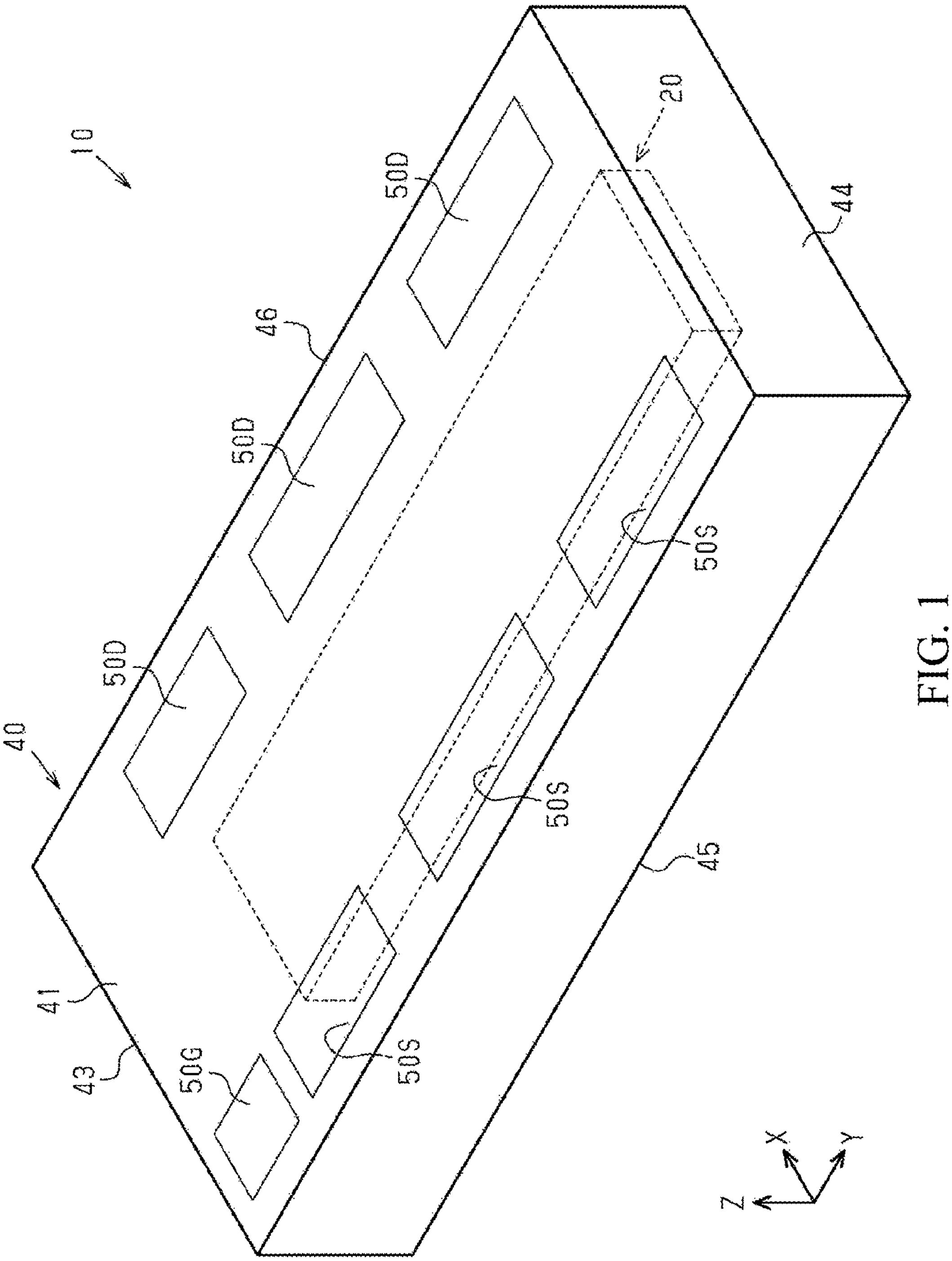
FIG. 1 is a perspective diagram of a semiconductor device according to a first embodiment.
Figure 2:
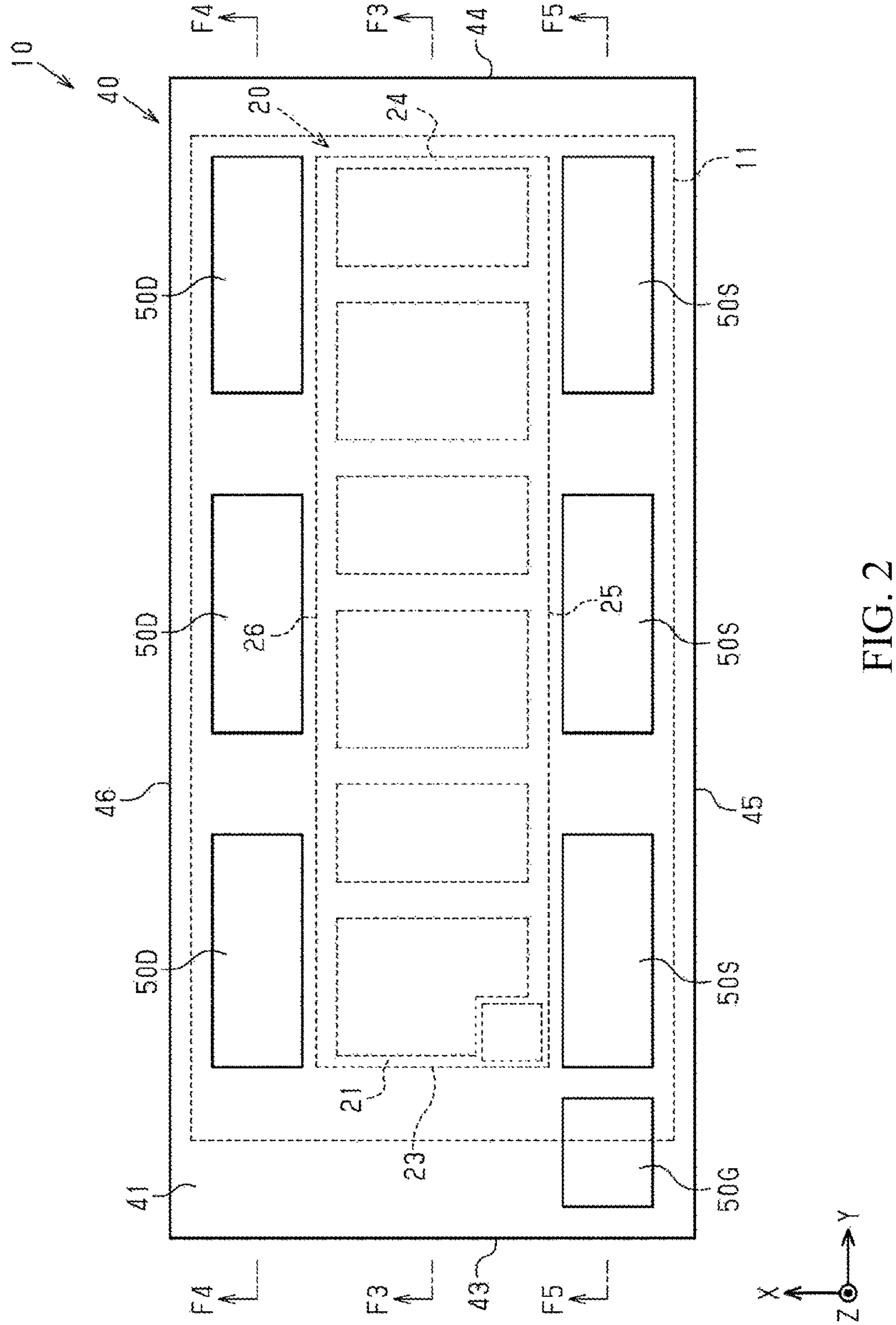
FIG. 2 is a plan view of the semiconductor device in FIG. 1.
Figure 3:
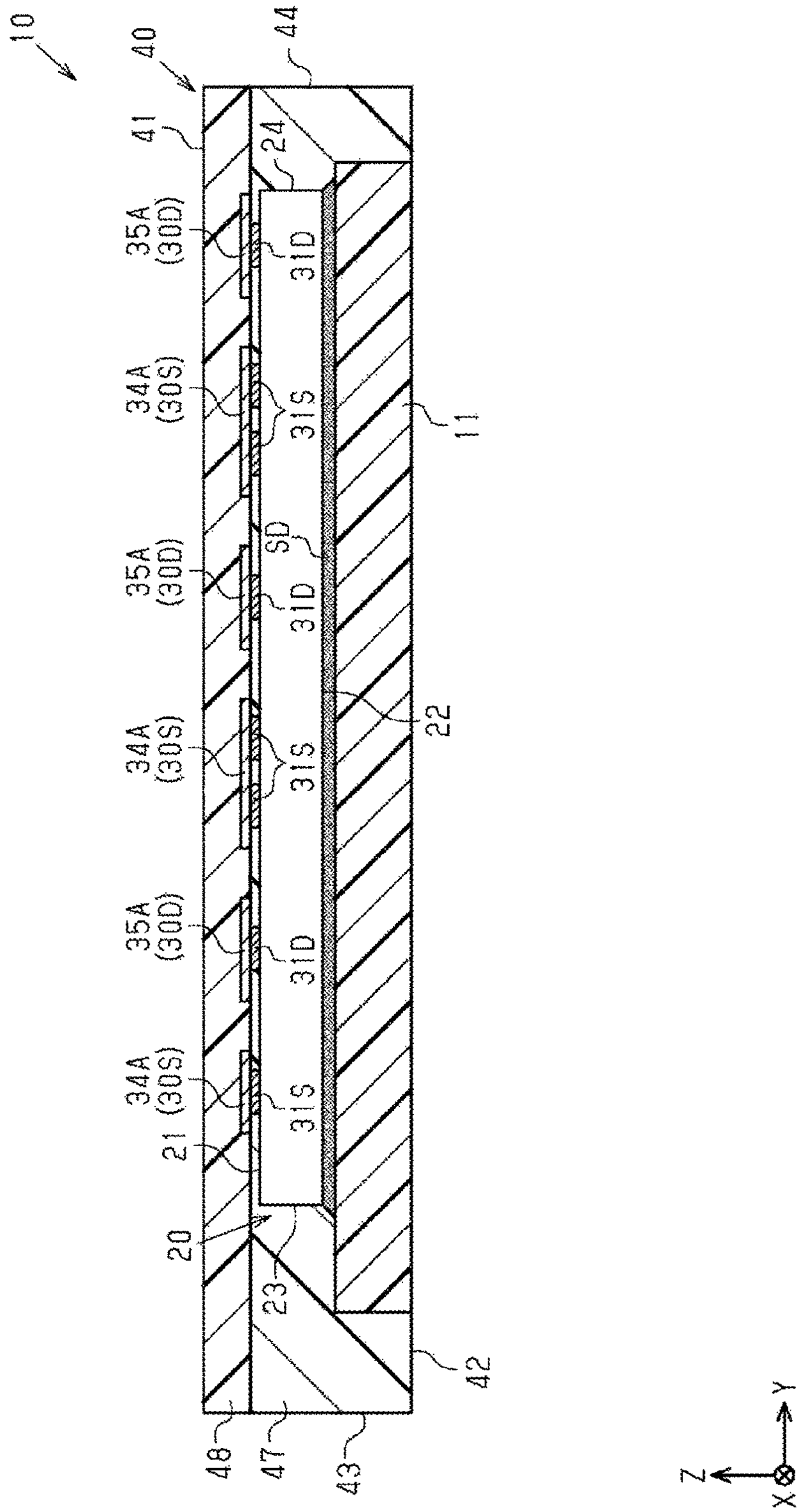
FIG. 3 is a cross-sectional diagram obtained by cutting a semiconductor device along a line F3-F3 in FIG. 2.
Figure 4:
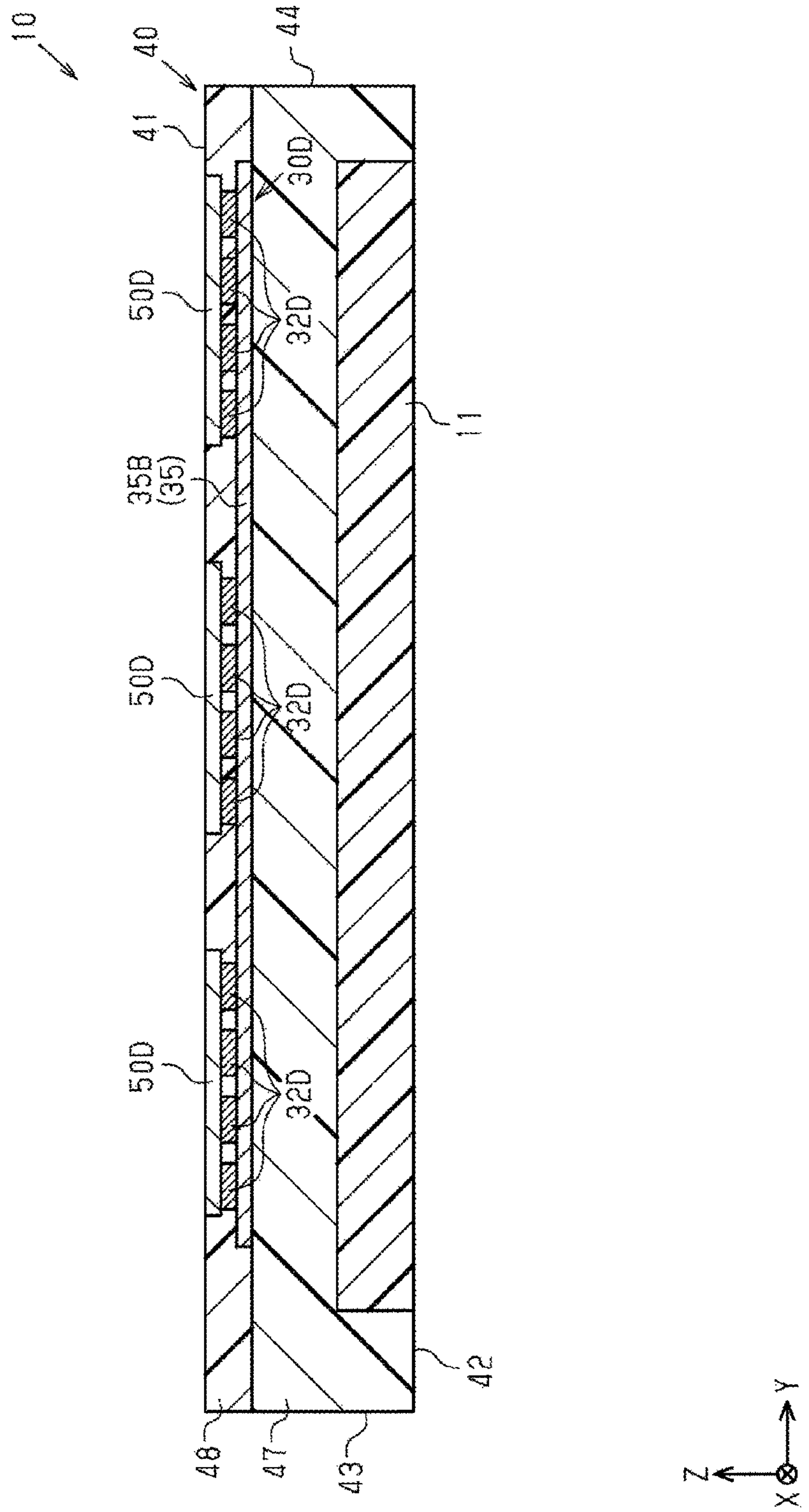
FIG. 4 is a cross-sectional diagram obtained by cutting a semiconductor device along a line F4-F4 in FIG. 2.
Figure 5:
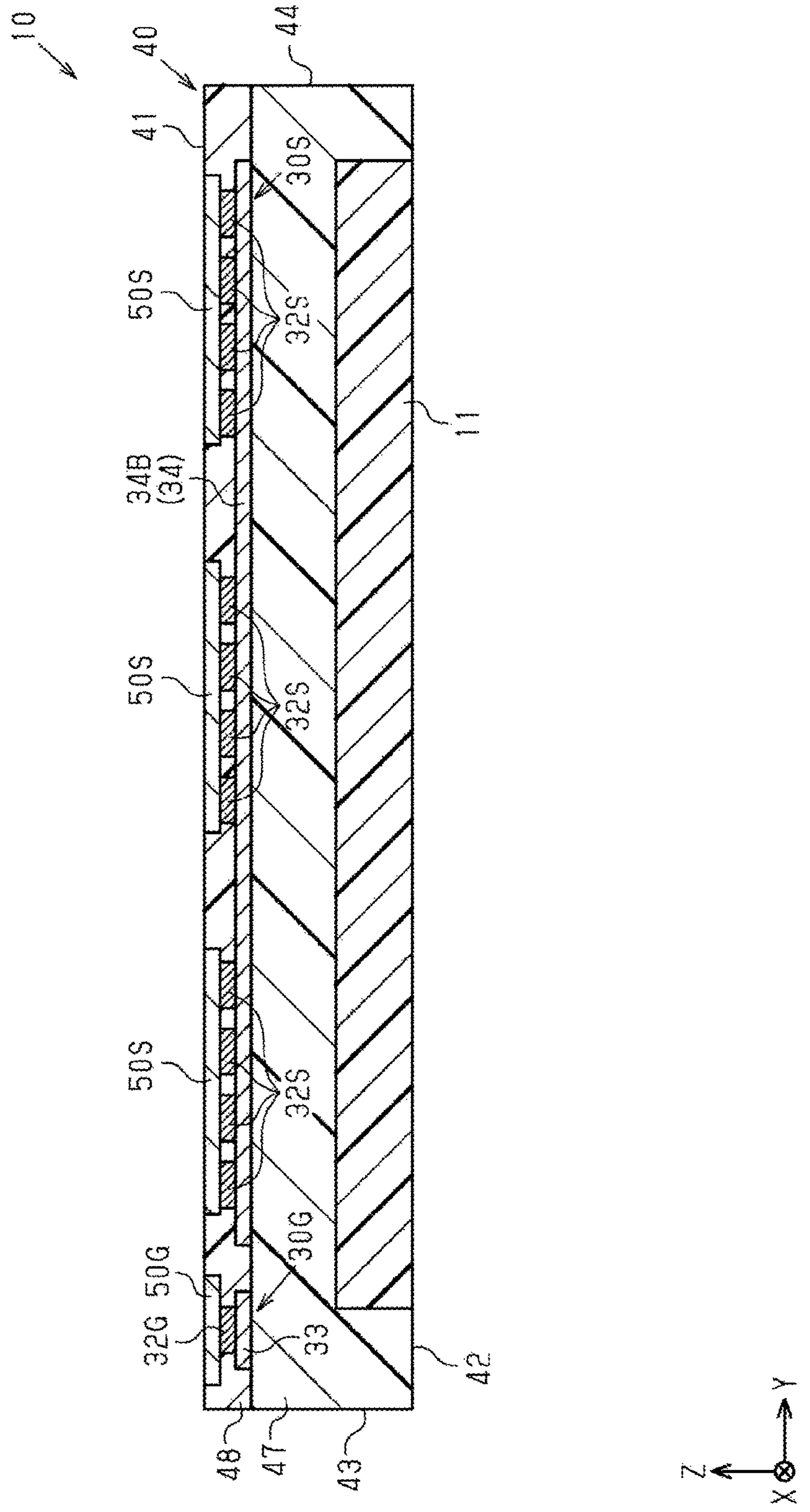
FIG. 5 is a cross-sectional diagram obtained by cutting a semiconductor device along a line F5-F5 in FIG. 2.
Figure 6:
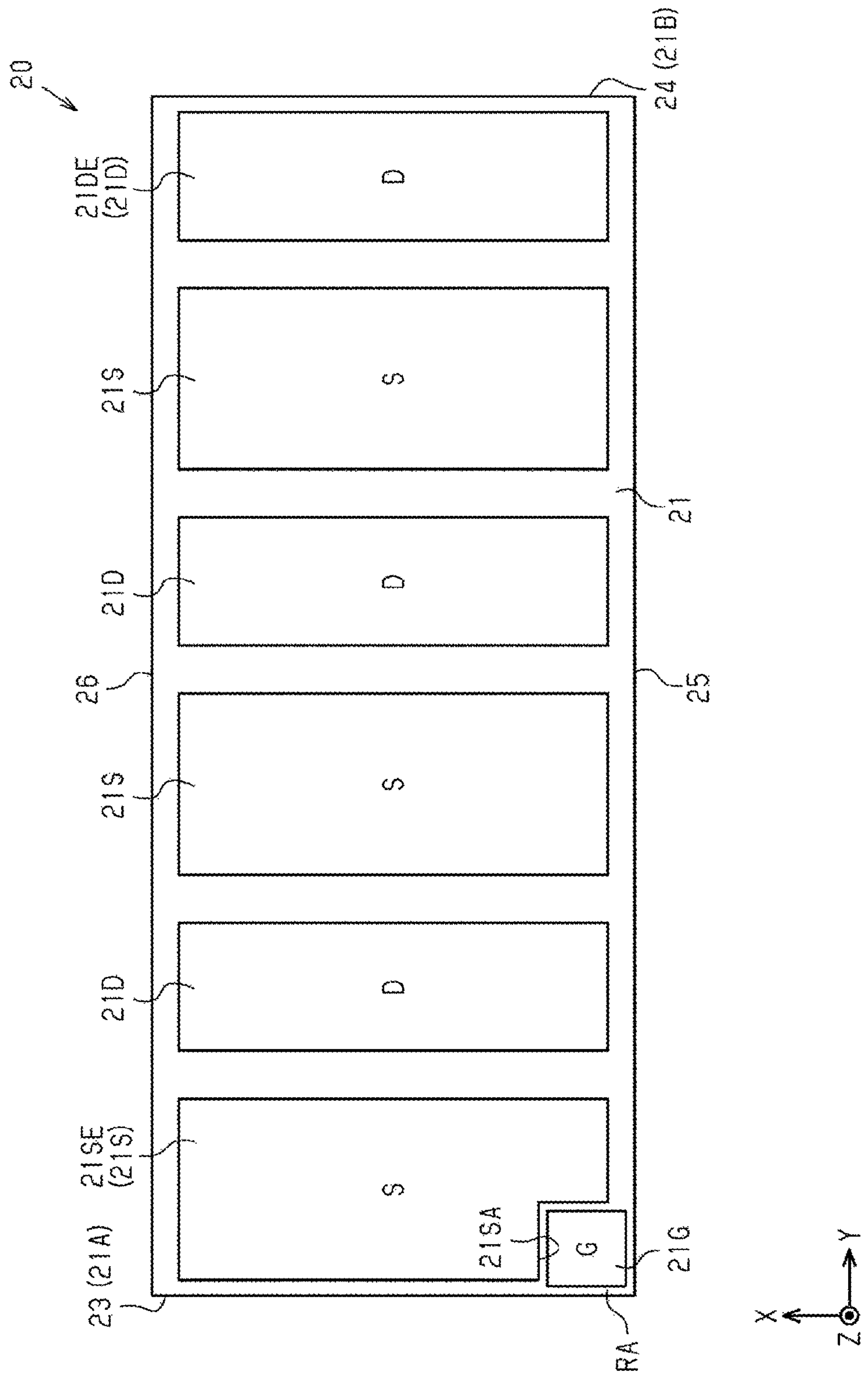
FIG. 6 is a plan view of a switching element of the first embodiment.
Figure 7:
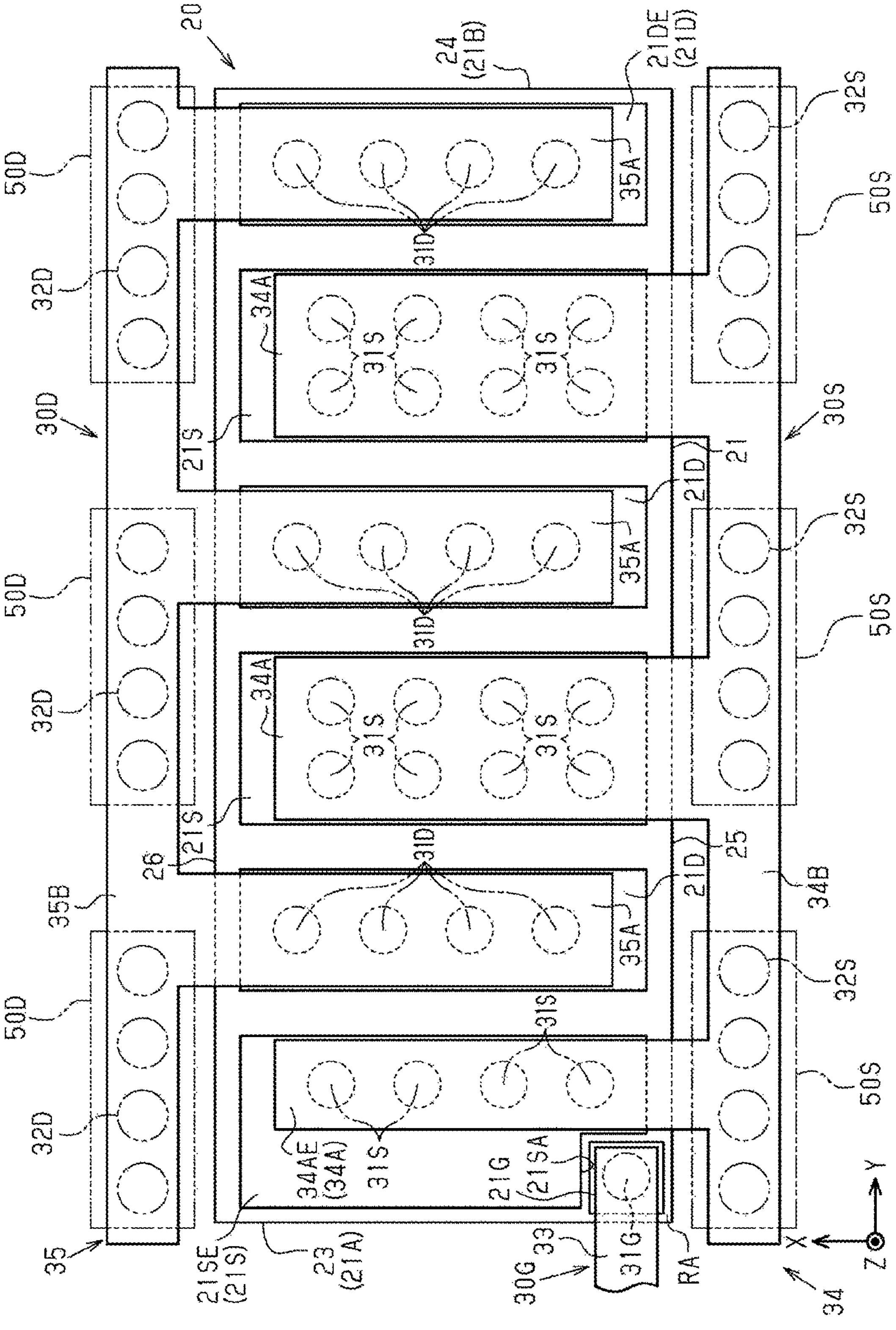
FIG. 7 is a plan view of a position relation of the switching element in FIG. 6 with a drain wiring, a source wiring and a gate wiring.
Figure 8:
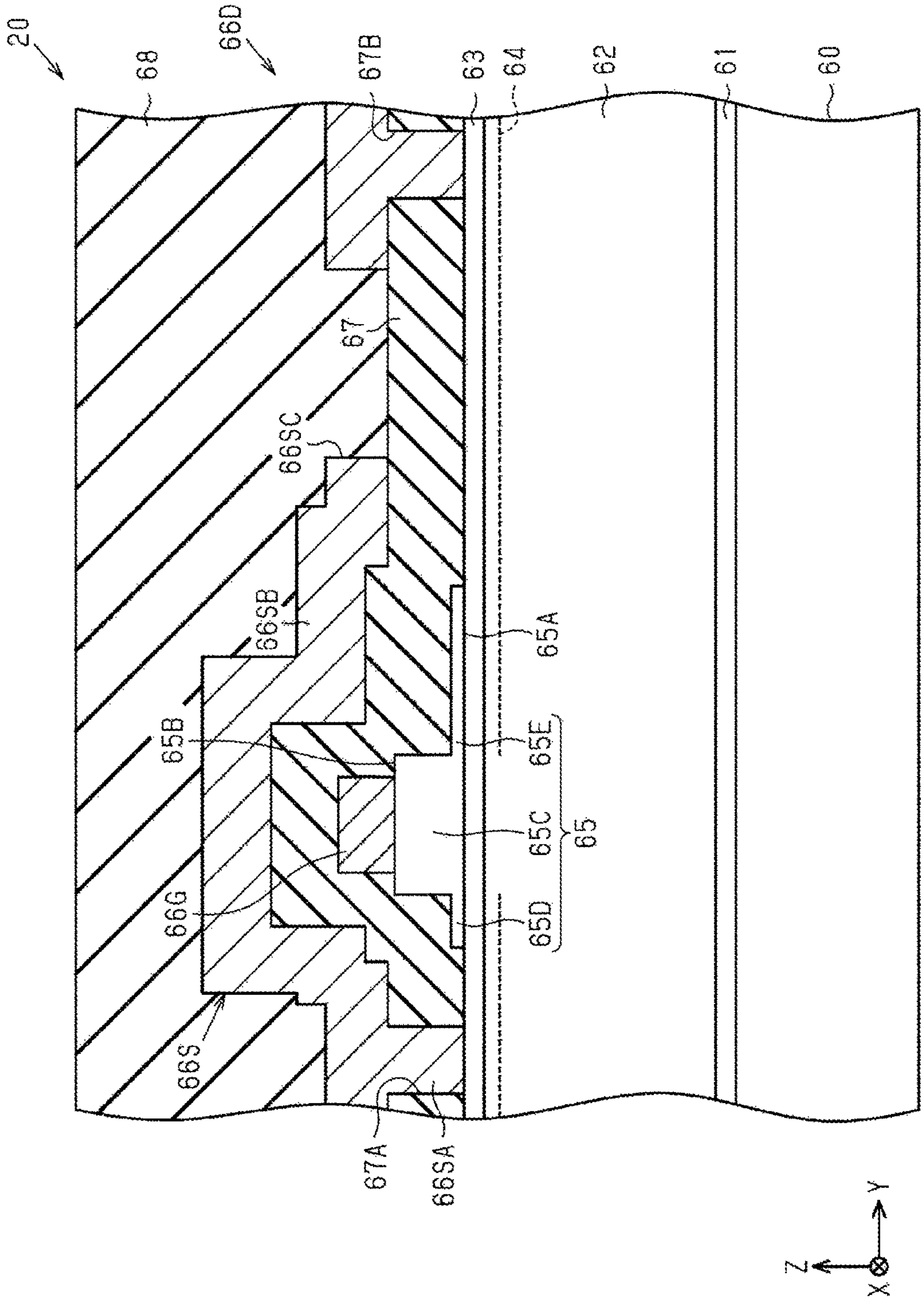
FIG. 8 is a schematic cross-sectional diagram representing a part of a switching element.

FIG. 1 and FIG. 2 show an external structure of the semiconductor device 10, and FIG. 3 to FIG. 5 show an internal structure of the semiconductor device 10. FIG. 6 and FIG. 7 show a planar structure of a semiconductor element 20 described later, and FIG. 8 shows a partial internal structure of the semiconductor element 20.

As shown in FIG. 1, the semiconductor device 10 is formed as a rectangular tablet. The semiconductor device 10 includes the semiconductor element 20, a sealing resin 40 sealing the semiconductor element 20, and a gate terminal 50G, source terminals 50S and drain terminals 50D which are external terminals exposed from the sealing resin 40.

The sealing resin 40 is a component that forms a device surface of the semiconductor device 10, and is formed as a rectangular tablet. The sealing resin 40 is formed of, for example, an insulating resin. For example, the resin is black epoxy resin. Moreover, the thickness direction of the sealing resin 40 is set as "Z direction", and two mutually orthogonal directions orthogonal to the Z direction are respectively set as "X direction" and "Y direction". Moreover, in the description below, a view of observing the semiconductor device 10 from the Z direction is referred to as a "plan view".

In a plan view, the sealing resin 40 is formed as rectangular in shape, wherein the X direction is referred to as a width direction (short-side direction) and the Y direction is a length direction. In an example, the thickness of the sealing resin 40 is less than the width of the sealing resin 40.

The sealing resin 40 has a sealing front surface 41 and a sealing back surface 42 facing directions opposite to each other in the Z direction, and first to fourth sealing side surfaces 43 to 46 connecting the sealing front surface 41 and the sealing back surface 42. In an example, both of the sealing front surface 41 and the sealing back surface 42 are planes orthogonal to the Z direction. The first to fourth sealing side surfaces 43 to 46 are surfaces crossing the sealing front surface 41 and the sealing back surface 42. In the first embodiment, the first to fourth sealing side surfaces 43 to 46 are surfaces orthogonal to the sealing front surface 41 and the sealing back surface 42. The first sealing side surface 43 and the second sealing side surface 44 form two end surfaces of the sealing resin 40 in the Y direction, and extend in the X direction in a plan view. The third sealing side surface 45 and the fourth sealing side surface 46 form two end surfaces of the sealing resin 40 in the X direction, and extend in the Y direction in a plan view.

The semiconductor element 20 is formed as a rectangular tablet having the Z direction as a thickness direction. As such, the Z direction becomes the thickness direction of the semiconductor element 20, and thus a "plan view" can also be referred to as viewing from the thickness direction of the semiconductor element 20. In a plan view, the semiconductor element 20 is formed as rectangular in shape, wherein the X direction is a width direction (short-side direction) and the Y direction is a length direction. In an example, the thickness of the semiconductor element 20 is less than the width of the semiconductor element 20. As such, the semiconductor element 20 has its width direction and length direction configured the same as those of the sealing resin 40.

As shown in FIG. 2 and FIG. 3, the semiconductor element 20 has an element front surface 21 and an element back surface 22 facing sides opposite to each other in the Z direction, and first to fourth element side surfaces 23 to 26 connecting the element front surface 21 and the element back surface 22. In an example, both of the element front surface 21 and the element back surface 22 are planes orthogonal to the Z direction. The element front surface 21 faces the same side as the sealing front surface 41 of the sealing resin 40, and the element back surface 22 faces the same side as the sealing back surface 42. The first element side surface 23 and the second element side surface 24 form two end surfaces in the Y direction, and extend in the X direction in a plan view. The third element side surface 25 and the fourth element side surface 26 form two end surfaces in the X direction, and extend in the Y direction in a plan view. In a plan view, the first element side surface 23 and the second element side surface 24 are orthogonal to the third element side surface 25 and the fourth element side surface 26.

The semiconductor element 20 is a switching element having a gate electrode 66G, a source electrode 66S and a drain electrode 66D (referring to FIG. 8) to be described shortly. The semiconductor element 20 is separately electrically connected to the gate terminal 50G, the source terminals 50S, and the drain terminals 50D. Details of connection structures of the semiconductor element 20 with the gate terminal 50G, the source terminals 50S, and the drain terminals 50D are also to be described below.

As shown in FIG. 4 and FIG. 5, the gate terminal 50G, the source terminals 50S, and the drain terminals 50D are exposed from the sealing front surface 41 of the sealing resin 40. In an example, the gate terminal 50G, the source terminals 50S, and the drain terminals 50D are embedded in the sealing resin 40, respectively. Moreover, the gate terminal 50G, the source terminals 50S, and the drain terminals 50D can also be formed on the sealing front surface 41. As such, it can be said that the gate terminal 50G, the source terminals 50S, and the drain terminals 50D are formed on the sealing front surface 41.

As shown in FIG. 2, the drain terminals 50D are positioned closer to the fourth sealing side surface 46 than the center of the sealing front surface 41 in the X direction. The drain terminals 50D are provided as multiple in number (three in the first embodiment). The multiple drain terminals 50D are located at the same position in the X direction, and are spaced from each other in the Y direction. In a plan view, each of the drain terminals 50D is formed as rectangular in shape, wherein the Y direction is the length direction and the X direction is the width direction (short-side direction).

The source terminals 50S are positioned closer to the third sealing side surface 45 than the center of the sealing front surface 41 in the X direction. The source terminals 50S are provided as multiple in number (three in the first embodiment). The multiple source terminals 50S are located at the same position in the X direction, and are spaced from each other in the Y direction. In a plan view, each of the source terminals 50S is formed as rectangular in shape, wherein the Y direction is the length direction and the X direction is the width direction (short-side direction).

The gate terminal 50G is positioned closer to the third sealing side surface 45 than the center of the sealing front surface 41 in the X direction. Moreover, the gate terminal 50G is positioned closer to the first sealing side surface 43 than the multiple source terminals 50S in the Y direction. The gate terminal 50G is located at, for example, the same position as the multiple source terminals 50S in the X direction. In a plan view, the gate terminal 50G is formed as rectangular in shape.

Moreover, the configurations of the drain terminals 50D and the source terminals 50S can be modified as desired. In an example, the drain terminals 50D can also be one in number. In this case, the drain terminals 50D can also be formed as a strip shape extending in the Y direction in a plan view. In an example, the source terminals 50S can also be one in number. In this case, the source terminals 50S can also be formed as a strip shape extending in the Y direction in a plan view.

As shown in FIG. 3, the semiconductor device 10 includes a support substrate 11 supporting the semiconductor element 20. The support substrate 11 is formed of an insulating material. The support substrate 11 is formed as a rectangular tablet having the Z direction as a thickness direction. The support substrate 11 is exposed from the sealing back surface 42. The semiconductor element 20 is mounted on the support substrate 11. More specifically, the semiconductor element 20 is bonded to the support substrate 11 by a bonding material SD.

The sealing resin 40 can be divided into a first sealing portion 47 sealing the semiconductor element 20, and a second sealing portion 48 formed on the first sealing portion 47 and including the sealing front surface 41. The support substrate 11 is disposed at the first sealing portion 47. The gate terminal 50G, the source terminals 50S, and the drain terminals 50D are disposed at the second sealing portion 48, respectively. The first sealing portion 47 is disposed to cover the element front surface 21 of the semiconductor element 20. Thus, the second sealing portion 48 is spaced from the element front surface 21 in the Z direction.

[Planar Structure of Semiconductor Element]

FIG. 6 shows a schematic planar structure of the semiconductor element 20.

As shown in FIG. 6, in the first embodiment, the element front surface 21 of the semiconductor element 20 includes a first end 21A and a second end 21B as two ends in the Y direction. Between the two ends of the element front surface 21 in the Y direction, the first end 21A is an end that is close to the first element side surface 23, and the second end 21B is and end that is close to the second element side surface 24. It can be said that in a plan view, on the element front surface 21, the first end 21A is formed at a position overlapping the first element side surface 23. It can be said that, on the element front surface 21, the second end 21B is formed at a position overlapping the second element side surface 24.

The semiconductor element 20 includes a gate pad 21G, multiple (three in the first embodiment) source pads 21S and multiple (three in the first embodiment) drain pads 21D. The gate pad 21G, the multiple source pads 21S and the multiple drain pads 21D are formed on the element front surface 21 of the semiconductor element 20. In the first embodiment, the number of the source pads 21S is the same as the number of the drain pads 21D.

Both the multiple source pads 21S and the multiple drain pads are alternately arranged in the Y direction. Alternatively speaking, both the multiple source pads 21S and the multiple drain pads 21D are alternately arranged in the length direction of the element front surface 21. Herein, in the first embodiment, the Y direction corresponds to "a first direction along the element front surface 21". Thus, alternatively speaking, both the multiple source pads 21S and the multiple drain pads 21D are alternately arranged in the first direction along the element front surface 21.

In the first embodiment, the multiple source pads 21S and the multiple drain pads 21D are arranged from the first end 21A toward the second end 21B in an order of the source pad 21S, the drain pad 21D, the source pad 21S, the drain pad 21D, the source pad 21S and the drain pad 21D. Thus, it can be said that the source pad 21S is disposed at the first end 21A. The source pad 21S disposed at the first end 21A corresponds to an "end pad". In the description below, sometimes the source pad 21S corresponding to the end pad is referred to as a "source pad 21SE".

In a plan view, each of the multiple source pads 21S and the multiple drain pads 21D is formed as rectangular in shape, wherein the Y direction is set as the width direction, and the X direction along the element front surface 21 and orthogonal to the Y direction is set as the length direction. In the first embodiment, the X direction corresponds to "a second direction along the element front surface 21 and orthogonal to the first direction (Y direction)".

Herein, the Y direction is an arrangement direction of the multiple source pads 21S and the multiple drain pads 21D, and so the respective width directions of the multiple source pads 21S and the multiple drain pads 21D are consistent with the arrangement direction. Thus, the width direction of each of the multiple source pads 21S and the multiple drain pads 21D corresponds to the "first direction". Moreover, the Y direction is the length direction of the element front surface 21, and so the respective width directions of the multiple source pads 21S and the multiple drain pads 21D are consistent with the length direction of the element front surface 21. Moreover, the X direction is the width direction (short-side direction) of the element front surface 21, and so the respective length directions of the multiple source pads 21S and the multiple drain pads 21D are consistent with the width direction (short-side direction) of the element front surface 21. Moreover, the respective length directions of the multiple source pads 21S and the multiple drain pads 21D are orthogonal to the width direction in a plan view, and thus correspond to the "second direction".

The source pad 21SE includes a recess 21SA which is formed in a corner portion located close to the first end 21A of the element front surface 21. Herein, in the first embodiment, the corner portion located close to the first end 21A of the element front surface 21 is, among four corners of the element front surface 21, a corner portion that is close to the first element side surface 23 and the third element side surface 25.

On the element front surface 21, the gate pad 21G is arranged in a region RA formed by the recess 21SA and disposed in the corner portion. The region RA is a region surrounded by the recess 21SA, the first element side surface 23 and the third element side surface 25 in a plan view. In a plan view, the gate pad 21G is formed as rectangular in shape.

A distance between the source pad 21SE and the first end 21A of the element front surface 21 in the Y direction is less than the width of each of the multiple source pads 21S and the multiple drain pads 21D. In an example, a distance between the source pad 21SE and the first end 21A of the element front surface 21 in the Y direction is less than ½ of the width of each of the multiple source pads 21S and the multiple drain pads 21D. In an example, a distance between the source pad 21SE and the first end 21A of the element front surface 21 in the Y direction is less than ⅓ of the width of each of the multiple source pads 21S and the multiple drain pads 21D. In an example, a distance between the source pad 21SE and the first end 21A of the element front surface 21 in the Y direction is less than ¼ of the width of each of the multiple source pads 21S and the multiple drain pads 21D.

Among the multiple drain pads 21D, the drain pad 21D that is disposed near the second end 21B of the element front surface 21 is set as a "drain pad 21DE". A distance between the drain pad 21DE and the second end 21B of the element front surface 21 in the Y direction is less than the width of each of the multiple source pads 21S and the multiple drain pads 21D. In an example, a distance between the drain pad 21DE and the second end 21B of the element front surface 21 in the Y direction is less than ½ of the width of each of the multiple source pads 21S and the multiple drain pads 21D. In an example, a distance between the drain pad 21DE and the second end 21B of the element front surface 21 in the Y direction is less than ⅓ of the width of each of the multiple source pads 21S and the multiple drain pads 21D. In an example, a distance between the drain pad 21DE and the second end 21B of the element front surface 21 in the Y direction is less than ¼ of the width of each of the multiple source pads 21S and the multiple drain pads 21D.

Next, a size relation between the multiple source pads 21S and the multiple drain pads 21D is to be described below. In the description below, the size of each of the multiple source pads 21S and the multiple drain pads 21D refers to a size of the portion of each of the multiple source pads 21S and the multiple drain pads 21D exposed from the sealing resin 40.

As shown in FIG. 6, a source area which is a total area of the multiple source pads 21S is greater than a drain area which is a total area of the multiple drain pads 21D. In the first embodiment, in a plan view, the area of each of the multiple source pads 21S is greater than the area of each of the multiple drain pads 21D. Thus, the source area which is a total (total area) of the areas of the multiple source pads 21S is greater than the drain area which is a total (total area) of the areas of the multiple drain pads 21D. A ratio of the source area to the drain area is between 5/3 and 2.

In the first embodiment, the width of the multiple source pads 21S is greater than the width of the multiple drain pads 21D. In the first embodiment, the width of each of the multiple source pads 21S is greater than the width of each of the multiple drain pads 21D. Herein, the width of the source pad 21SE refers to the width of the portion in the source pad 21SE that is closer to the fourth element side surface 26 than the recess 21SA. The length of the multiple source pads 21S in the length direction is equal to the length of the multiple drain pads 21D in the length direction. Herein, given that a difference between the length of the source pads 21S in the length direction and the length of the drain pads 21D in the length direction is within 10%, it can be said that the length of the source pads 21S in the length direction is equal to the length of the drain pads 21D in the length direction.

Herein, the width of the source pads 21S refers to the size of the source pads 21S in the width direction, and in other words, refers to the size of the source pads 21S in the Y direction (first direction). The width of the drain pads 21D refers to the size of the drain pads 21D in the width direction, and in other words, refers to the size of the drain pads 21D in the Y direction (first direction).

[Connection Structures of Semiconductor Element with Gate Terminal, Source Terminals and Drain Terminals]

Referring to FIG. 3 to FIG. 7, details of connection structures of the semiconductor element 20 with the gate terminal 50G, the source terminals 50S, and the drain terminals 50D are described below. Moreover, in FIG. 7, for better illustration purposes, double-dot dashed lines are used to represent the drain terminals 50D and the source terminals 50S, and second through vias 32D and 32S to be described shortly.

As shown in FIG. 7, the semiconductor device 10 includes a gate wiring 30G connecting the gate pad 21G and the gate terminal 50G, a source wiring 30S connecting the source pads 21S and the source terminals 50S, and a drain wiring 30D connecting the drain pads 21D and the drain terminals 50D. Each of the gate wiring 30G, the source wiring 30S and the drain wiring 30D is formed of, for example, a copper (Cu)-containing material.

Each of the gate wiring 30G, the source wiring 30S and the drain wiring 30D is disposed in the sealing resin 40. More specifically, as shown in FIG. 3 to FIG. 5, each of the gate wiring 30G, the source wiring 30S and the drain wiring 30D is disposed to cross the first sealing portion 47 and the second sealing portion 48.

As shown in FIG. 5 and FIG. 7, the gate wiring 30G includes a first through via 31G connected to the gate pad 21G, a second through via 32G connected to the gate terminal 50G, and a gate wiring portion 33 connecting the first through via 31G and the second through via 32G.

As shown in FIG. 7, the first through via 31G is disposed at a position overlapping the gate pad 21G in a plan view. In the Z direction, the first through via 31G passes through a portion of the first sealing portion 47 that covers the element front surface 21 of the semiconductor element 20.

As shown in FIG. 5, the second through via 32G is disposed at a position overlapping the gate terminal 50G in a plan view. The gate terminal 50G is disposed closer to the first sealing side surface 43 than the gate pad 21G, and thus the second through via 32G is disposed closer to the first sealing side surface 43 than the first through via 31G. In the Z direction, the second through via 32G passes through a portion of the second sealing portion 48 between the gate wiring portion 33 and the gate terminal 50G.

The gate wiring 33 extends in a direction orthogonal to the Z direction to overlap both the first through via 31G and the second through via 32G in a plan view. The gate wiring portion 33 is disposed on the first sealing portion 47 and is covered by the second sealing portion 48.

As shown in FIG. 3, FIG. 5 and FIG. 7, the source wiring 30S includes a first through via 31S connected to the source pad 21S, a second through via 32S connected to the source terminal 50S, and a source wiring portion 34 connecting the first through via 31S and the second through via 32S. Herein, the first through via 31S corresponds to a “first source through via”, and the second through via 32S corresponds to a “second source through via”.

As shown in FIG. 7, the first through via 31S is disposed at a position overlapping each of the multiple source pads 21S in a plan view. The first through via 31S is provided as multiple in number. As shown in FIG. 3, in the Z direction, the multiple first through vias 31S pass through the portion of the first sealing portion 47 that covers the element front surface 21 of the semiconductor element 20.

As shown in FIG. 7, the second through via 32S is disposed at a position overlapping each of the multiple source terminals 50S in a plan view. The second through via 32S is provided as multiple in number. In an example, the number of the second through vias 32S is less than the number of the first through vias 31S. As shown in FIG. 5, in the Z direction, the multiple second through vias 32S pass through the portion of the second sealing portion 48 between the source wiring portion 34 and the source terminals 50S.

The source wiring portion 34 is disposed on the first sealing portion 47 and is covered by the second sealing portion 48. As shown in FIG. 7, the source wiring portion 34 is disposed to overlap each of the multiple source pads 21S and each of the multiple source terminals 50S in a plan view.

The source wiring portion 34 includes a source tooth portion 34A and a source connection portion 34B. In the first embodiment, the source tooth portion 34A and the source connection portion 34B are formed integrally.

As shown in FIG. 7, the source tooth portion 34A corresponds to the number of the source pads 21S and is thus provided as multiple in number. That is to say, the number of the source tooth portion 34A is the same as the number of the source pads 21S. Each of the multiple source tooth portions 34A extends in the X direction. That is to say, each of the multiple source tooth portions 34A extends in the width direction (short-side direction) of the element front surface 21. In a plan view, each of the source tooth portions 34 is formed as rectangular in shape, wherein the X direction is the length direction and the Y direction is the width direction (short-side direction). The multiple source tooth portions 34A are in a distributed arrangement corresponding to the multiple source pads 21S. Thus, in a plan view, the source tooth portions 34A are disposed at positions overlapping the source pads 21S. The multiple first through vias 31S are disposed within a region overlapping both the source tooth portions 34A and the source pads 21S in a plan view.

Among the source tooth portions 34A, the source tooth portion 34A corresponding to the source pad 21SE is set as "source tooth portion 34AE". The width of the source tooth portion 34AE is less than the width of the other source tooth portions 34A. Thus, the number of the first through via 31S connecting the source pad 21SE and the source tooth portion 34AE is less than the number of the first through vias 31S connecting the other source pads 21S and the source tooth portions 34A.

The source connection portion 34B is positioned closer to the third sealing side surface 45 than the multiple source pads 21S in the X direction. The source connection portion 34B is positioned closer to the third sealing side surface 45 than the semiconductor element 20 in the X direction. The source connection portion 34B extends in the Y direction. That is to say, it can be said that the source connection portion 34B extends in the length direction of the semiconductor element 20 (element front surface 21). In a plan view, the source connection portion 34B is formed as rectangular in shape, wherein the Y direction is the length direction and the X direction is the width direction (short-side direction).

The drain wiring 30D includes a first through via 31D connected to the drain pad 21D, a second through via 32D connected to the drain terminal 50D, and a drain wiring portion 35 connecting the first through via 31D and the second through via 32D. Herein, the first through via 31D corresponds to a "first drain through via", and the second through via 32D corresponds to a "second drain through via".

The first through via 31D is disposed at a position overlapping each of the multiple drain pads 21D in a plan view. As shown in FIG. 7, the first through via 31D is provided as multiple in number. In the Z direction, the multiple first through vias 31D pass through a portion of the first sealing portion 47 that covers the element front surface 21 of the semiconductor element 20.

The second through via 32D is disposed at a position overlapping each of the multiple drain terminals 50D in a plan view. As shown in FIG. 7, the second through via 32D is provided as multiple in number. In an example, the number of the second through vias 32D is less than the number of the first through vias 31D. In the Z direction, the multiple second through vias 32D pass through the second sealing portion 48.

The drain wiring portion 35 is disposed on the first sealing portion 47. The drain wiring portion 35 is disposed to overlap each of the multiple drain pads 21D and each of the multiple drain terminals 50D in a plan view.

The drain wiring portion 35 includes a drain tooth portion 35A and a drain connection portion 35B. In the first embodiment, the drain tooth portion 35A and the drain connection portion 35B are formed integrally.

As shown in FIG. 7, the drain tooth portion 35A corresponds to the number of the drain pads 21D and is provided as multiple in number. That is to say, the number of the drain tooth portions 35A is the same as the number of the drain pads 21D. In the first embodiment, the number of the drain pads 21D is the same as the number of the source pads 21S, and thus the number of the drain tooth portions 35A is the same as the number of the source tooth portions 34A. Each of the multiple drain tooth portions 35A extends in the X direction. That is to say, each of the multiple drain tooth portions 35A extends in the width direction (short-side direction) of the element front surface 21. In a plan view, each of the drain tooth portions 35A is formed as rectangular in shape, wherein the X direction is the length direction and the Y direction is the width direction (short-side direction). The multiple drain tooth portions 35A are in a distributed arrangement corresponding to the multiple drain pads 21D. Thus, in a plan view, the drain tooth portions 35A are disposed at positions overlapping the drain pads 21D. The multiple first through vias 31D are disposed within a region overlapping both the drain tooth portions 35A and the drain pads 21D in a plan view.

The length of the drain tooth portions 35A in the length direction (X direction) is equal to the length of the source tooth portions 34A in the length direction (X direction). On the other hand, the width of the drain pads 21D is less than the width of the source pads 21S, and thus the width of the drain tooth portions 35A is less than the width of the source tooth portions 34A. Thus, in a plan view, the area of the drain tooth portions 35A is less than the area of the source tooth portions 34A. In other words, in a plan view, the area of the source tooth portions 34A is greater than the area of the drain tooth portions 35A. Thus, in the first embodiment, the number of the first through via 31D connecting one drain pad 21D and one drain tooth portion 35A is less than the number of the first through via 31S connecting one source pad 21S and the source wiring 30S of one source tooth portion 34A. In other words, the number of the first through via 31S connecting one source pad 21S and one source tooth portion 34A is greater than the number of the first through via 31D connecting one drain pad 21D and one drain tooth portion 35A. Moreover, in the first embodiment, the number of the source pads 21S is the same as the number of the drain pads 21D, and the number of the drain tooth portions 35A is the same as the number of the source tooth portions 34A, and thus a total number of the first through vias 31D is less than a total number of the first through vias 31S. In other words, the total number of the first through vias 31S is greater than the total number of the first through vias 31D. As a result, a connection area of the multiple source pads 21S and the source wiring 30S is greater than a connection area of the multiple drain pads 21D and the drain wiring 30D.

The drain connection portion 35B is disposed at a position closer to the fourth sealing side surface 46 than the multiple drain pads 21D in the X direction. The drain connection portion 35B is disposed at a position closer to the fourth sealing side surface 46 than the semiconductor element 20 in the X direction. The drain connection portion 35B extends in the Y direction. That is to say, it can be said that the drain connection portion 35B extends in the length direction of the semiconductor element 20 (element front surface 21). In a plan view, the drain connection portion 35B is formed as rectangular in shape, wherein the Y direction is the length direction and the X direction is the width direction (short-side direction).

An area of the drain connection portion 35B in a plan view is substantially equal to an area of the source connection portion 34B in a plan view. Thus, in the first embodiment, the number of the second through vias 32D is the same as the number of the second through vias 32S of the source wiring 30S. As a result, a connection area of the source wiring 30S and the multiple source terminals 50S is equal to a connection area of the drain wiring 30D and the multiple drain terminals 50D.

As such, the connection area of the source wiring 30S and the multiple source terminals 50S is equal to the connection area of the drain wiring 30D and the multiple drain terminals 50D; on the other hand, the connection area of the multiple source pads 21S and the source wiring 30S is greater than the connection area of the multiple drain pads 21D and the drain wiring 30D. Thus, it can be said that the connection area of the source wiring 30S is greater than the connection area of the drain wiring 30D.

Moreover, the respective numbers and configuration forms of the multiple first through vias 31S and the multiple second through vias 32S of the source wiring 30S, and the multiple first through vias 31D and the multiple second through vias 32D of the drain wiring 30D, are simplified to better illustrate the relations of the numbers of the through vias, and are different from the actual numbers and configuration forms.

[Internal Structure of Semiconductor Element]

FIG. 8 shows a cross-sectional view of an example of a brief cross-section structure of the semiconductor element 20. Moreover, some shading lines are omitted from the perspective of ease of observation for the accompanying drawings. The semiconductor element 20 shown in FIG. 8 is a Gallium Nitride High Electron Mobility Transistor (GaN HEMT).

The semiconductor element 20 includes a semiconductor substrate 60. The semiconductor substrate 60 can be formed as a rectangular tablet. The semiconductor substrate 60 can be formed of, for example, silicon (Si), silicon carbide (SiC), gallium nitride (GaN), sapphire, or other substrate materials. In an example, the semiconductor substrate 60 can also be a Si substrate. The thickness of the semiconductor substrate 60 is, for example, 200 μm or more and 1500 μm or less.

The semiconductor element 20 includes a buffer layer 61 formed over the semiconductor substrate 60, an electron transit layer 62 formed over the buffer layer 61, and an electron supply layer 63 formed over the electron transit layer 62. Each of the buffer layer 61, the electron transit layer 62 and the electron supply layer 63 has a thickness in the Z direction.

The buffer layer 61 can be formed by any material capable of inhibiting wafer warping or cracking caused by mismatch between thermal expansion coefficients of the semiconductor substrate 60 and the electron transit layer 62. For example, the buffer layer 61 can include one or more nitride semiconductor layers. For example, the buffer layer 61 can include at least one of an aluminum nitride (AlN) layer, an aluminum gallium nitride (AlGaN) layer, and a graded AlGaN layer with different aluminum (Al) compositions. For example, the buffer layer 61 can be formed by one single AlN film, one single AlGaN film, a film having an AlGaN/GaN superlattice structure, a film having an AlN/AlGaN superlattice structure, or a film having an AlN/GaN superlattice structure.

In one embodiment, the buffer layer 61 can include a first buffer layer and a second buffer layer, wherein the first buffer layer is an AlN layer formed on the semiconductor substrate 60, and the second buffer layer is an AlGaN layer formed on the AlN layer (first buffer layer). For example, the first buffer layer can be an AlN layer having a thickness of 200 nm, and the second buffer layer can be a graded AlGaN layer having a thickness of 300 nm. Moreover, to inhibit a leakage current in the buffer layer 61, an impurity can be introduced to a portion of the buffer layer 61 such that a region other than a surface-layer region of the buffer layer 61 is semi-insulative. In this case, the impurity is, for example, carbon (C) or iron (Fe). A concentration of the impurity can be set to be $4\times10^{16}$ $cm^{-3}$ or more.

The electron transit layer 62 can be formed of a nitride semiconductor. The electron transit layer 62 can be a GaN layer, for example. The thickness of the electron transit layer 62 is set to, for example, 0.5 μm or more and 2 μm or less. Moreover, in order to inhibit a leakage current in the electron transit layer 62, an impurity can be introduced to a portion of the electron transit layer 62 such that a region other than a surface-layer region of the electron transit layer 62 is semi-insulative. In this case, the impurity is, for example, C. A concentration of the impurity can be set to be $4\times10^{16}$ $cm^{-3}$ or more. That is to say, the electron transit layer 62 can include multiple GaN layers with impurities of different concentrations, and in one example, can include a GaN layer doped with C and a non-doped GaN layer. In this case, the GaN layer doped with C is formed on the buffer layer 61. The GaN layer doped with C may have a thickness of 0.5 μm or more and 2 μm or less. The C concentration of the GaN layer doped with C can be set to $5\times10^{17}$ $cm^{-3}$ or more and $9\times10^{19}$ $cm^{-3}$ or less. The non-doped GaN layer is formed on the GaN layer doped with C. The non-doped GaN layer can have a thickness of 0.05 μm or more and 0.4 μm or less. The non-doped GaN layer is connected to the electron supply layer 63. In an example, the electron transit layer 62 includes a GaN layer doped with C and having a thickness of 0.4 μm, and a non-doped GaN layer having a thickness of 0.4 μm. The C concentration of the GaN layer doped with C is approximately $2\times10^{19}$ $cm^{-3}$.

The electron supply layer 63 has a bandgap greater than that of the electron transit layer 62. The electron supply layer 63 can be, for example, an AlGaN layer. In the nitride semiconductor, the bandgap increases as the Al composition gets higher. Thus, the electron supply layer 63 which is an AlGaN layer has a bandgap greater than that of the electron transit layer 62 which is a GaN layer. In one example, the electron supply layer 63 is formed by $Al_xGa_{1-x}N$. That is to say, the electron supply layer 63 can be referred to as an $Al_xGa_{1-x}N$ layer, where x is $0<x<0.4$, and more preferably $0.1<x<0.3$. The electron supply layer 63 can have a thickness of, for example, 5 nm or more and 20 nm or less.

The electron transit layer 62 and the electron supply layer 63 have different lattice constants in block regions. Thus, the electron transit layer 62 and the electron supply layer 63 are bonding of a lattice mismatched system. Due to spontaneous polarization of the electron transit layer 62 and the electron supply layer 63 as well as piezoelectric polarization caused by stress upon the heterojunction of the electron transit layer 62, a conduction band energy level of the electron transit layer 62 near the heterojunction interface between the electron transit layer 62 and the electron supply layer 63 is lower than a Fermi level. Thus, at a position near the heterojunction interface between the electron transit layer 62 and the electron supply layer 63 (for example, a position distanced from the interface by approximately several nm), a two-dimensional electron gas (2DEG) 64 is diffused in the electron transit layer 62.

The semiconductor element 20 further includes a gate layer 65 formed over the electron supply layer 63, a gate electrode 66G formed over the gate layer 65, and a passivation layer 67 covering the electron supply layer 63, the gate layer 65 and the gate electrode 66G. The passivation layer 67 has a source opening 67A and a drain opening 67B disposed on two sides of an extension direction of the gate layer 65 relative to the gate layer 65 in a plan view. The gate layer 65 is disposed at a position closer to the source opening 67A of the passivation layer 67 than the drain opening 67B.

The gate layer 65 has a bandgap less than that of the electron supply layer 63 and is formed by a nitride semiconductor containing an impurity of an acceptor type. The gate layer 65 can be formed by, for example, any material having a bandgap less than that of the electron supply layer 63 which is an AlGaN layer. In an example, the gate layer 65 is a GaN layer doped with an impurity of an acceptor type (p-type GaN layer). The impurity of an acceptor type can include at least one of zinc (Zn), magnesium (Mg) and C. The maximum concentration of the impurity of an acceptor type in the gate layer 65 is, for example, $1\times10^{18}$ $cm^{-3}$ or more and $1\times10^{20}$ $cm^{-3}$ or less.

By including the impurity of an acceptor type in the gate layer 65, the energy levels of the electron transit layer 62 and the electron supply layer 63 are increased. Thus, in a region right below the gate layer 65, the conduction band energy level of the electron transit layer 62 near the heterojunction interface between the electron transit layer 62 and the electron supply layer 63 is substantially same as or greater than the Fermi level. Hence, when a voltage of zero bias is not applied to the gate electrode 66G, the 2DEG 64 is not formed in the electron transit layer 62 in the region right below the gate layer 65. On the other hand, the 2DEG 64 is formed in the electron transit layer 62 in a region other than the region right below the gate layer 65.

As such, due to the existence of the gate layer 65 doped with an impurity of an acceptor type, the 2DEG 64 is depleted in the region right below the gate layer 65. As a result, a normally off operation of the semiconductor element 20 is achieved. When an appropriate on-voltage is applied to the gate electrode 66G, a channel generated by the 2DEG 64 is formed in the electron transit layer 62 in a region right below the gate electrode 66G, hence forming a source-drain conduction.

The gate layer 65 has a bottom surface 65A connected to the electron supply layer 63, and an upper surface 65B on opposite side to the bottom surface 65A. The gate electrode 66G is formed on the upper surface 65B of the gate layer 65. When viewing along the cross section in FIG. 8, the gate layer 65 can have a rectangular, trapezoidal or ridged cross section. Moreover, the gate layer 65 viewed along the cross section in FIG. 8 refers to a structure obtained by cutting off the gate layer 65 in a plane orthogonal to an extension direction of the gate layer 65 in a plan view when viewing from the extension direction of the gate layer 65.

In an example, the gate layer 65 includes: a ridge 65C, including an upper surface 65B for forming the gate electrode 66G; and two extensions (a first extension 65D and a second extension 65E), extending to outer sides of the ridge 65C in a plan view.

The first extension 65D extends from the ridge 65C toward the source opening 67A in a plan view. The first extension 65D is distanced from the source opening 67A.

The second extension 65E extends from the ridge 65C toward the drain opening 67B in a plan view. The second extension 65E is distanced from the drain opening 67B.

The ridge 65C is located between the first extension 65D and the second extension 65E, and is formed integrally with the first extension 65D and the second extension 65E. The first extension 65D and the second extension 65E are formed to sandwich the ridge 65C in a width direction of the ridge 65C. Herein, the width direction of the ridge 65C is a direction orthogonal to an extension direction of the ridge 65C in a plan view.

Due to the existence of the first extension 65D and the second extension 65E, the bottom surface 65A of the gate layer 65 has an area greater than that of the upper surface 65B. In an example, the second extension 65E extends longer toward the outer side of the ridge 65C than the first extension 65D in a plan view.

The ridge 65C is equivalent to a thicker portion of the gate layer 65. The thickness of the ridge 65C can be determined with consideration of parameters including a gate threshold voltage. In an example, the thickness of the ridge 65C is 110 nm or more. Herein, the thickness of the gate layer 65 can be defined by a distance between the upper surface 65B and the bottom surface 65A of the ridge 65C in the Z direction.

Each of the first extension 65D and the second extension 65E has a thickness less than the thickness of the ridge 65C. In an example, each of the first extension 65D and the second extension 65E has a thickness less than ½ of the thickness of the ridge 65C.

The gate electrode 66G is formed by one or more metal layers. In an example, the gate electrode 66G is a titanium nitride (TiN) layer. Alternatively, the gate electrode 66G can also be formed by a first metal layer and a second metal layer, wherein the first metal layer is formed of a Ti-containing material, and the second metal layer is laminated on the first metal layer and is formed of a TiN-containing material. In an example, the thickness of the gate electrode 66G can be greater than the thickness of the gate layer 65.

The passivation layer 67 can be formed by a material containing at least one of silicon nitride (SiN), silicon dioxide ($SiO_2$), silicon oxynitride (SiON), aluminum oxide ($Al_2O_3$), AlN and aluminum oxynitride (AlON). In an example, the passivation layer 67 is formed of a SiN-containing material. A portion of the passivation layer 67 covering the gate layer 65 and the gate electrode 66G is formed along surfaces of the gate layer 65 and the gate electrode 66G, and thus has an uneven surface. The thickness of the passivation layer 67 is, for example, 200 nm or less.

The semiconductor element 20 further includes the source electrode 66S and the drain electrode 66D.

The source electrode 66S is connected to the electron supply layer 63 exposed from the source opening 67A. The drain electrode 66D is connected to the electron supply layer 63 exposed from the drain opening 67B.

The source electrode 66S and the drain electrode 66D are formed by one or multiple metal layers (for example, Ti, Al, AlCu and TiN). The source electrode 66S and the drain electrode 66D are in ohmic contact with the 2DEG 64 through the source opening 67A and the drain opening 67B, respectively.

The source electrode 66S includes a source contact 66SA, and a field plate 66SB continuous with the source contact 66SA. The source contact 66SA is equivalent to a portion filling the source opening 67A. The field plate 66SB and the source contact 66SA are formed integrally. The field plate 66SB covers the passivation layer 67. The field plate 66SB includes an end 66SC located between the drain opening 67B and the gate layer 65 in a plan view. Thus, the field plate 66SB is formed to be spaced from the drain electrode 66D formed at the drain opening 67B. The field plate 66SB extends from the source contact 66SA to the end 66SC along a surface of the passivation layer 67 toward the drain electrode 66D. The field plate 66SB functions to alleviate an electric field concentration near an end of the gate electrode 66G when a gate voltage of zero bias is not applied to the gate electrode 66G.

The drain electrode 66D includes a first portion filling the drain opening 67B, and a second portion formed on the passivation layer 67 around a periphery of the drain opening 67B. The first portion and the second portion are formed integrally.

The semiconductor device 10 further includes an interlayer insulation film 68 covering the drain electrode 66D, the source electrode 66S and the passivation layer 67. The interlayer insulation film 68 is formed of, for example, a $SiO_2$-containing material.

The gate electrode 66G is electrically connected to the gate pad 21G (referring to FIG. 2) through a first gate wiring layer (not shown). The source electrode 66S is electrically connected to the source pad 21S (referring to FIG. 2) through a first source wiring layer (not shown). The drain electrode 66D is electrically connected to the drain pad 21D (referring to FIG. 2) through a first drain wiring layer (not shown). Each of the first gate wiring layer, the first source wiring layer and the drain wiring layer is disposed in the interlayer insulation film 68.

Moreover, the gate electrode 66G can also be electrically connected to the gate pad 21G through the first gate wiring layer and a second gate wiring layer connected to the first gate wiring layer. That is to say, the gate electrode 66G can also be electrically connected to the gate pad 21G through multiple gate wiring layers. Moreover, the source electrode 66S can also be electrically connected to the source pad 21S through the first source wiring layer and a second source wiring layer connected to the first source wiring layer. That is to say, the source electrode 66S can also be electrically connected to the source pad 21S through multiple source wiring layers. Moreover, the drain electrode 66D can also be electrically connected to the drain pad 21D through the first drain wiring layer and a second drain wiring layer connected to the first drain wiring layer. That is to say, the drain electrode 66D can also be electrically connected to the drain pad 21D through multiple drain wiring layers.

Effects

Effects of the first embodiment are described below.

In the semiconductor element 20 of the first embodiment, a source area which is a total of the area of each of the multiple source pads 21S is greater than a drain area which is a total of the area of each of the multiple drain pads 21D. Accordingly, a connection area of multiple source pads 21S and the source wiring 30S in the source wiring 30S connecting the multiple source pads 21S and the multiple source terminals 50S is made larger than a connection area of the multiple drain pads 21D and the drain wiring 30D in the drain wiring 30D connecting the multiple drain pads 21D and the multiple drain terminals 50D. Thus, parasitic inductance in a conductive path between the source electrode 66S and the source terminal 50S in the semiconductor element 20 can be reduced.

The parasitic inductance in the conductive path between the source terminal 50S and the source electrode 66S affects the operation of the semiconductor device 10. For example, the parasitic inductance causes a change in the source-gate voltage between the source electrode 66S and the gate electrode 66G in the semiconductor element 20, such that the semiconductor element 20 is erroneously turned on. Thus, by reducing the parasitic inductance in the conductive path, malfunction of the semiconductor device 10 can be inhibited. Moreover, the parasitic inductance affects a drain current flowing between the drain and the source of the semiconductor element 20, leading to a switching delay of the semiconductor element 20. Thus, by reducing the parasitic inductance in the conductive path, switching performance of the semiconductor device 10 can be enhanced.

Effects

The semiconductor element 20 and the semiconductor device 10 according to the first embodiment achieve the following effects.

(1-1) The semiconductor element 20 includes the element front surface 21 on which the gate pad 21G, the multiple drain pads 21D and the multiple source pads 21S are formed. The source area which is the total area of the multiple source pads 21S is greater than the drain area which is the total area of the multiple drain pads 21D.

According to the configuration above, the connection area of the source wiring 30S connected to the source pads 21S and the source pads 21S is made greater than the connection area of the drain wiring 30D connected to the drain pads 30S and the drain pads 21D, and therefore, parasitic inductance between the source terminals 50S and the source pads 21S connected to the source wiring 30S can be reduced.

(1-2) A ratio of the source area to the drain area is between 5/3 and 2.

According to the configuration above, the increase in the size of the semiconductor element 20 can be inhibited, and the parasitic inductance between the source terminal 50S and the source pad 21S connected to the source wiring 30S can be reduced.

(1-3) Both the multiple source pads 21S and the multiple drain pads 21D are alternately arranged in the Y direction which is the first direction of the element front surface 21. The area of each of the multiple source pads 21S is greater than the area of each of the multiple drain pads 21D.

According to the configuration above, the connection area of the source wiring 30S connected to the source pads 21S and the source pads 21S can be made greater than the connection area of the drain wiring 30D connected to the drain pads 30S and the drain pads 21D.

(1-4) The semiconductor device 10 includes the semiconductor element 20, the sealing resin 40 sealing the semiconductor element 20, and the gate terminal 50G, the source terminals 50S and the drain terminals 50D exposed from the sealing resin 40. Moreover, the semiconductor device 10 includes the gate wiring 30G connecting the gate pad 21G and the gate terminal 50G, the source wiring 30S connecting the multiple source pads 21S and the source terminals 50S, and the drain wiring 30D connecting the multiple drain pads 21D and the drain terminals 50D. The connection area of the source wiring 30S is greater than the connection area of the drain wiring 30D.

According to the configuration above, the parasitic inductance between the source terminals 50S and the source pads 21S connected to the source wiring 30S can be reduced. Thus, switching performance of the semiconductor device 10 can be enhanced.

(1-5) The multiple source pads 21S include the source pad 21SE serving as the end pad disposed near the first end 21A of the element front surface 21 in the Y direction. The distance between the first end 21A of the element front surface 21 on which the source pad 21SE is disposed and the source pad 21SE in the Y direction is less than the width of each of the multiple source pads 21S and the multiple drain pads 21D.

According to the configuration above, an occupancy rate of the source pads 21S and the drain pads 21D on the element front surface 21 can be increased. Thus, the number of the multiple source pads 21S can be increased, or the area of each of the source pads 21S can be increased.

(1-6) The multiple drain pads 21D include the drain pad 21DE serving as the end pad disposed near the second end 21B of the element front surface 21 in the Y direction. The distance between the second end 21B of the element front surface 21 on which the drain pad 21DE is disposed and the drain pad 21DE in the Y direction is less than the width of each of the multiple source pads 21S and the multiple drain pads 21D.

According to the configuration above, an occupancy rate of the source pads 21S and the drain pads 21D on the element front surface 21 can be increased. Thus, the number of the multiple source pads 21S can be increased, or the area of each of the source pads 21S can be increased.

Second Embodiment

Figure 9:
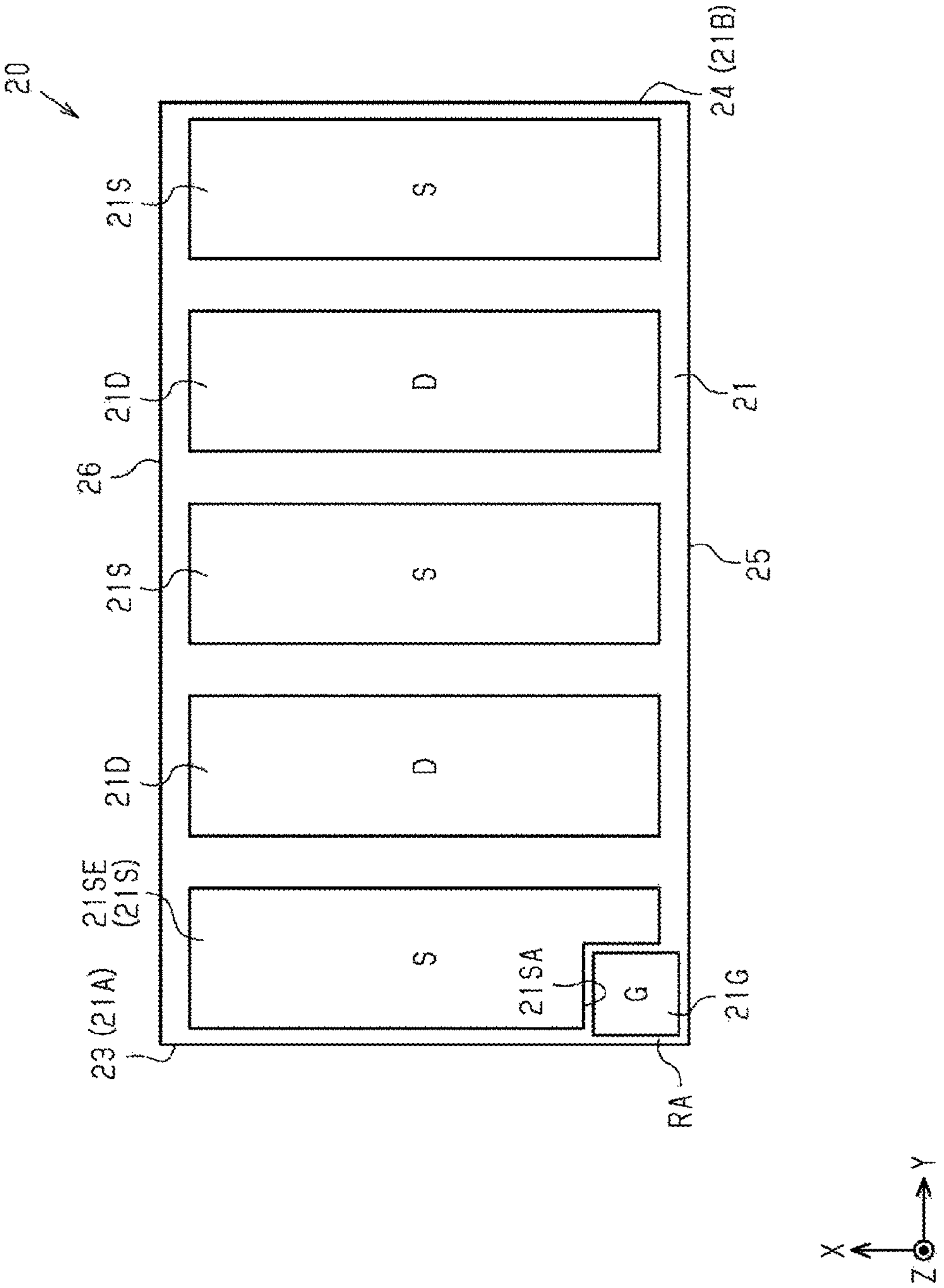
FIG. 9 is a plan view of a switching element of a second embodiment.
Figure 10:
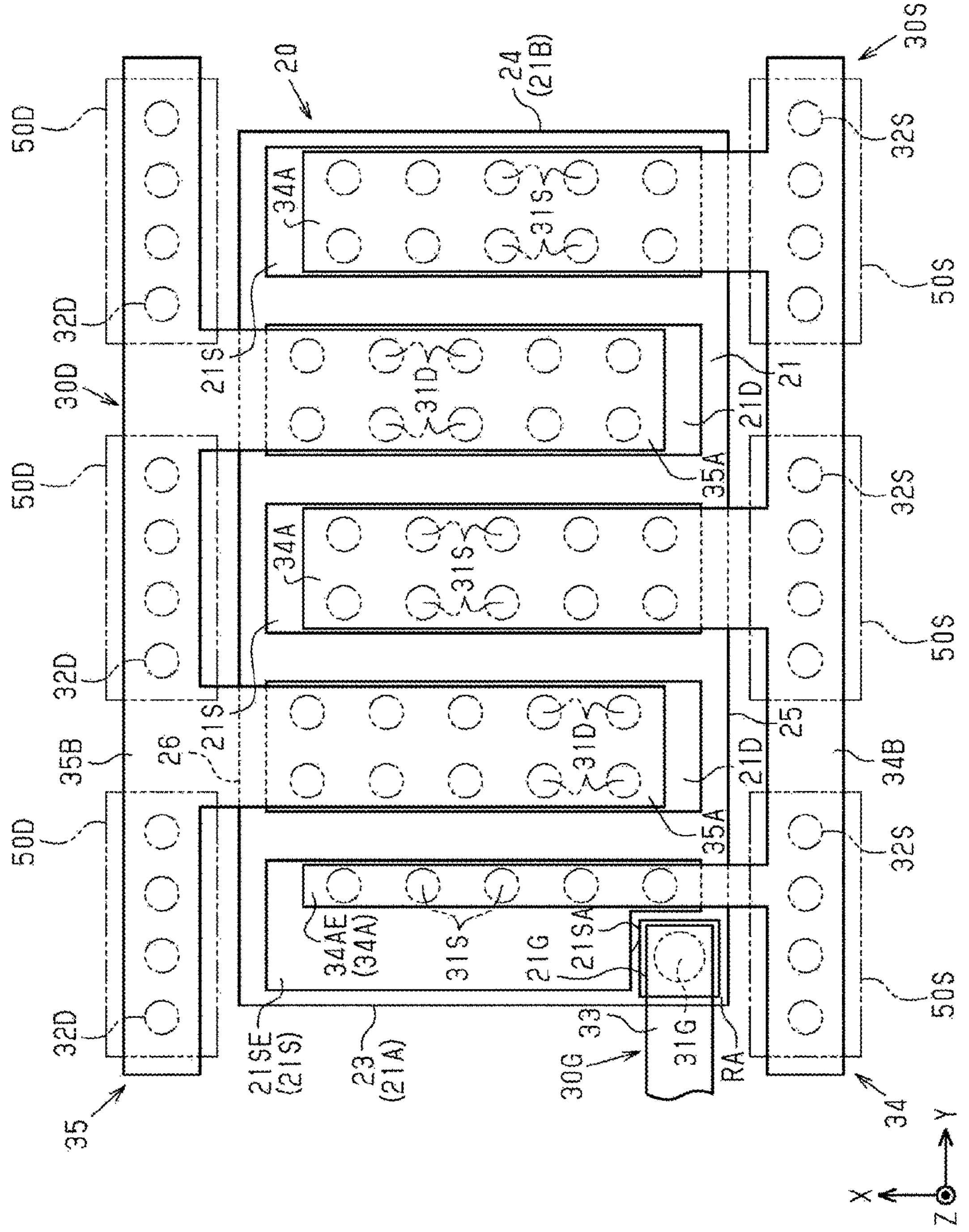
FIG. 10 is a plan view of a position relation of a switching element, a drain wiring, a source wiring and a gate wiring in a semiconductor device having the switching element in FIG. 9.

Referring to FIG. 9 to FIG. 10, a semiconductor device 10 according to the second embodiment is described below. Compared to the semiconductor device 10 of the first embodiment, the semiconductor device 10 of the second embodiment primarily differs in the respect of the configurations of the source pads 21S and the drain pads 21D. In the description below, aspects different from those of the first embodiment are described, and constituting elements common with those of the first embodiment are represented by the same numerals and symbols and associated details thereof are omitted for brevity. Moreover, in FIG. 10, for better illustration purposes, double-dot dashed lines are used to represent the drain terminals 50D, the source terminals 50S, and the second through vias 32D and 32S.

As shown in FIG. 9, in the semiconductor element 20 of the second embodiment, the number (three in the second embodiment) of the source pads 21S is greater than the number (two in the second embodiment) of the drain pads 21D.

Moreover, in the second embodiment, the width of the multiple source pads 21S other than the source pad 21SE is equal to the width of the multiple drain pads 21D. The length of the multiple source pads 21S in the length direction (X direction) is equal to the length of the multiple drain pads 21D in the length direction (X direction). Thus, the area of each of the multiple source pads 21S other than the source pad 21SE is equal to the area of each of the multiple drain pads 21D. Accordingly, the source area which is the total area of the multiple source pads 21S is greater than the drain area which is the total area of the multiple drain pads 21D.

Moreover, the width of each of the multiple source pads 21S is less than the width of each of the multiple source pads 21S of the first embodiment. Thus, the area of each of the multiple source pads 21S is less than the area of each of the multiple source pads 21S of the first embodiment.

Similar to the first embodiment, the source pad 21SE includes the recess 21SA. The gate pad 21G is disposed in the recess 21SA. Thus, the area of the source pad 21SE is less than the area of the other source pads 21S.

As shown in FIG. 10, in the semiconductor element 20 of the second embodiment, the main differences are the configurations of the source wiring 30S and the drain wiring 30D.

Similar to the first embodiment, the source wiring 30S includes multiple first through vias 31S, multiple second through vias 32S and the source wiring portion 34.

The multiple first through vias 31S are disposed to be connected to each of the source pads 21S. In the second embodiment, the area of each of the source pads 21S is less than that of the first embodiment, ad so the total number of the first through vias 31S connected to the source pads 21S is less than that of the first embodiment. On the other hand, the total number of the multiple second through vias 32S is the same as the total number of the multiple second through vias 32S of the first embodiment.

Similar to the first embodiment, the source wiring portion 34 includes multiple source tooth portions 34A and a source connection portion 34B. The number of the multiple source tooth portions 34A corresponds to the number of the multiple source pads 21S, and so the number of the multiple source tooth portions 34A of the second embodiment is the same as the number of the multiple source tooth portions 34A of the first embodiment. The width of the multiple source tooth portions 34A other than the source tooth portion 34A corresponding to the source pad 21SE corresponds to the width of the source pad 21S, and so the width of the multiple source tooth portions 34A other than the source tooth portion 34A corresponding to the source pad 21SE of the second embodiment is less than the width of the multiple source portions 34A other than the source tooth portion 34A corresponding to the source pad 21SE of the first embodiment. On the other hand, the length of each of the source tooth portions 34A in the length direction (X direction) is equal to the length of each of the source tooth portions 34A in the length direction (X direction) of the first embodiment. Thus, the area of the multiple source tooth portions 34A other than the source tooth portion 34A corresponding to the source pad 21SE of the second embodiment is less than the area of the multiple source tooth portions 34A other than the source tooth portion 34A corresponding to the source pad 21SE of the first embodiment. In other words, the source area of the second embodiment is less than the source area of the first embodiment. Moreover, the shape and size of the source connection portion 34B are the same as the shape and size of the source connection portion 34B of the first embodiment.

Similar to the first embodiment, the drain wiring 30D includes multiple first through vias 31D, multiple second through vias 32D and the drain wiring portion 35.

The multiple first through vias 31D are disposed to be connected to each of the multiple drain pads 21D. In the second embodiment, the number of the multiple drain pads 21D is less than that of the first embodiment, and so the total number of the multiple first through vias 31D connected to the drain pads 21D is less than that of the first embodiment. The width and the length in the length direction of each of the drain pads 21D are equal to those of the first embodiment. On the other hand, the total number of the multiple second through vias 32D is the same as the total number of the multiple second through vias 32D of the first embodiment.

Similar to the first embodiment, the drain wiring portion 35 includes the multiple drain tooth portions 35A and a drain connection portion 35B. The number of the multiple drain tooth portions 35A corresponds to the number of the multiple drain pads 21D, and so the number of the multiple drain tooth portions 35A of the second embodiment is less than the number of the multiple drain tooth portions 35A of the first embodiment. The width and the length of the drain tooth portions 35A in the length direction correspond to the width and the length of the drain pads 21D in the direction, and so the width and the length of the drain tooth portions 35A in the length direction of the second embodiment are equal to the width and the length of the drain tooth portions 35A in the length direction of the first embodiment. Thus, the area of each of the drain tooth portions 35A is equal to the area of each of the drain tooth portions 35A of the first embodiment. Moreover, the shape and size of the drain connection portion 35B are the same as the shape and size of the drain connection portion 35B of the first embodiment.

As described above, the respective numbers of the multiple source pads 21S and the multiple source tooth portions 34A are greater than the respective numbers of the multiple drain pads 21D and the multiple drain tooth portions 35A, and so the total number of the first through vias 31S of the source wiring 30S is greater than the total number of the first through vias 31D of the drain wiring 30D. On the other hand, similar to the first embodiment, the total number of the second through vias 32S of the source wiring 30S is the same as the total number of the second through vias 32D of the drain wiring 30D. Thus, the connection area of the source wiring 30S is greater than the connection area of the drain wiring 30D.

Effects

The semiconductor device 10 according to the second embodiment achieves the following effects.

(2-1) The width of the multiple source pads 21S is equal to the width of the multiple drain pads 21D. The number of the multiple source pads 21S is greater than the number of the multiple drain pads 21D.

According to the configuration above, the connection area of the source wiring 30S connected to the source pads 21S and the source pads 21S is made greater than the connection area of the drain wiring 30D connected to the drain pads 21D and the drain pads 21D, and therefore, parasitic inductance between the source terminals 50S and the source pads 21S connected to the source wiring 30S can be reduced.

Third Embodiment

Referring to FIG. 11 to FIG. 14, a semiconductor device 10 according to the third embodiment is described below. Compared to the semiconductor device 10 of the first embodiment, the semiconductor device 10 of the third embodiment primarily differs in the respect of the configurations of the gate terminal 50G, the source terminals 50S and the drain terminals 50D, and the configurations of the gate wiring 30G, the source wiring 30S and the drain wiring 30D. In the description below, aspects different from those of the first embodiment are described, and constituting elements common with those of the first embodiment are represented by the same numerals and symbols and associated details thereof are omitted for brevity.

Figure 11:
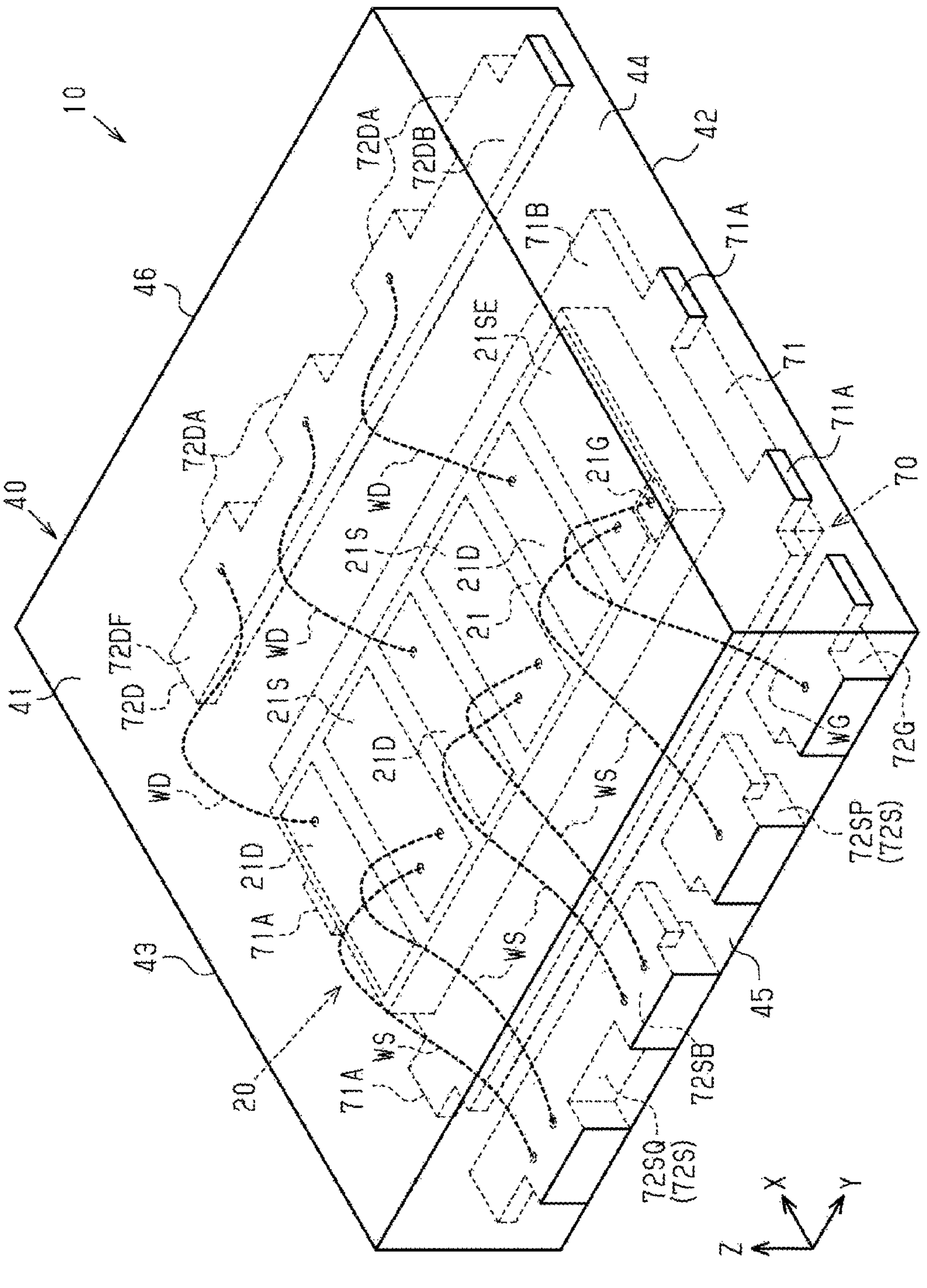
FIG. 11 is a perspective diagram of a semiconductor device according to a third embodiment.

As shown in FIG. 11, the semiconductor device 10 of the third embodiment includes a lead frame 70, which is an example of a conductive component electrically connected to the semiconductor element 20. The lead frame 70 is sealed by the sealing resin 40 in a state of being exposed from the sealing back surface 42. The sealing resin 40 of the third embodiment is different from the sealing resin 40 of the first embodiment, and is formed as square in shape in a plan view. Moreover, the sealing resin 40 of the third embodiment is an example, and is not limited to being square in shape in a plan view and can be formed as rectangular having the X direction or the Y direction as the length direction.

The lead frame 70 is formed of, for example, a copper (Cu)-containing material. In an example, a copper frame is used as the lead frame 70. A coating film can be disposed on a surface of the copper frame. The plating film can be, for example, silver (Ag) plating, or nickel (Ni)/palladium (Pd)/gold (Au) plating.

The lead frame 70 includes a die pad 71, a gate terminal 72G, a source terminal 72S and a drain terminal 72D. The gate terminal 72G, the source terminal 72S, and the drain terminal 72D are spaced from the die pad 71. Moreover, the gate terminal 72G, the source terminal 72S and the drain terminal 72D are spaced from each other.

The drain terminal 72D, the gate terminal 72G and the source terminal 72S are in a distributed arrangement at two ends of the sealing resin 40 in the X direction in a plan view. In the third embodiment, the drain terminal 72D is positioned at one of the two ends of the sealing resin 40 in the X direction that is close to the fourth sealing side surface 46 in a plan view. Both the gate terminal 72G and the source terminal 72S are, in a plan view, positioned at one of the two ends of the sealing resin 40 in the X direction that is close to the first sealing side surface 43. In a plan view, the gate terminal 72G and the source terminal 72S are located at the same position in the X direction, and are spaced from each other in the Y direction.

Figure 12:
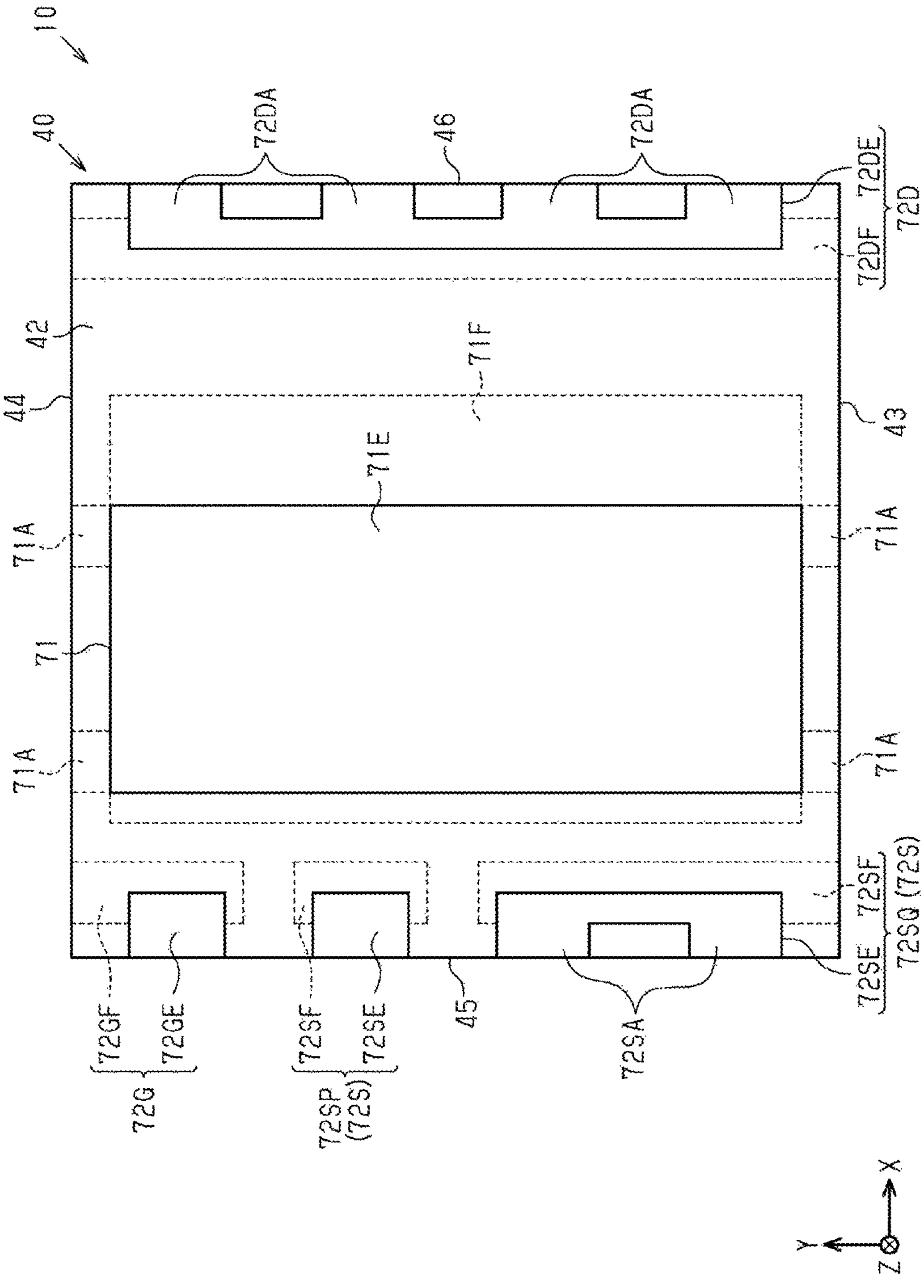
FIG. 12 is a rear view of the semiconductor device in FIG. 11.

The drain terminal 72D extends in the Y direction throughout the entire sealing resin 40. Two ends of the drain terminal 72D in the Y direction are exposed from the first sealing side surface 43 and the second sealing side surface 44. The drain terminal 72D includes multiple (four in the third embodiment) protrusions 72DA. The multiple protrusions 72DA are spaced from each other in the Y direction. As shown in FIG. 12, the multiple protrusions 72DA are exposed from the fourth sealing side surface 46.

Figure 13:
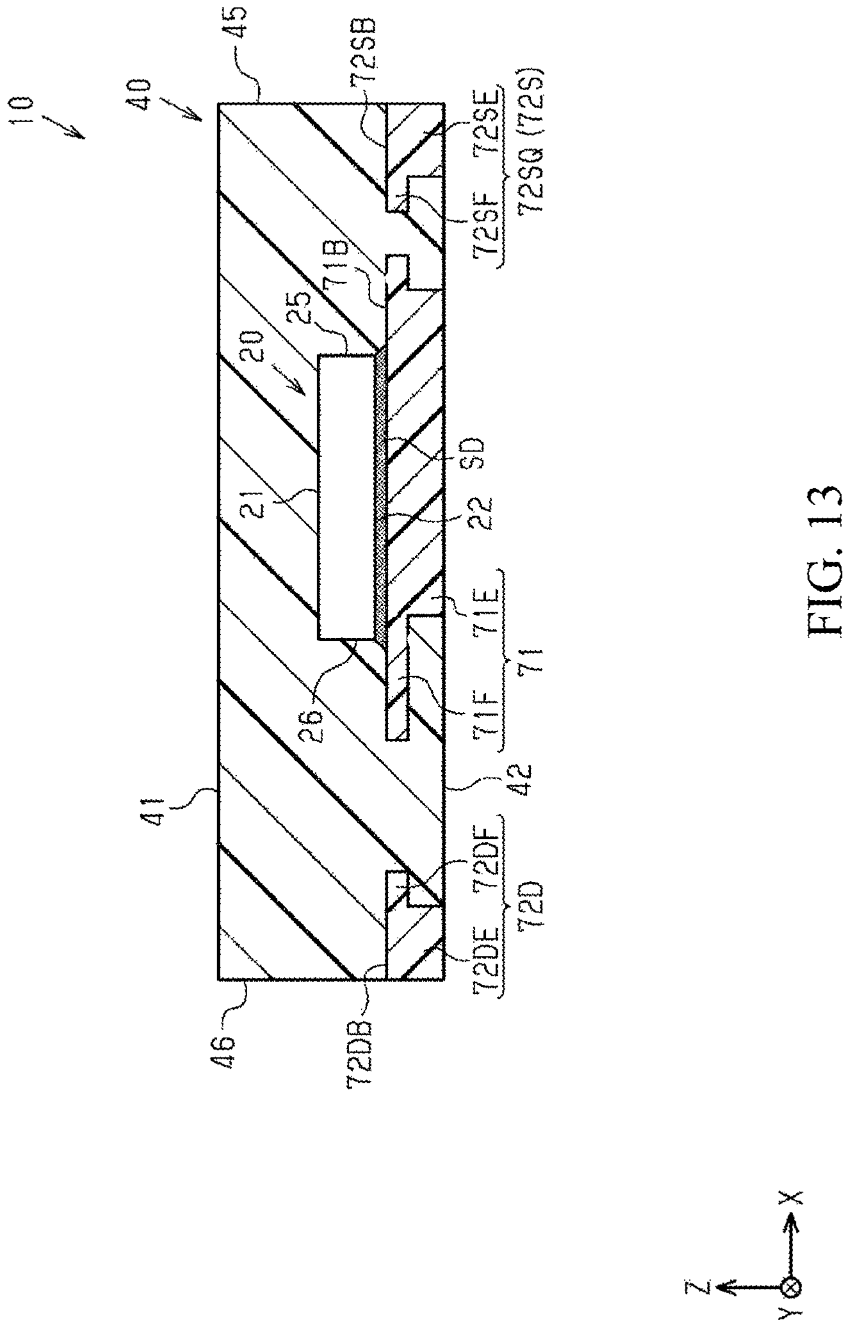
FIG. 13 is a schematic cross-sectional diagram of the semiconductor device in FIG. 11.

As shown in FIG. 12 and FIG. 13, the drain terminal 72D includes an external electrode portion 72DE and a flange 72DF. In an example, the external electrode portion 72DE and the flange 72DF are formed integrally. The external electrode portion 72DE is exposed from the sealing back surface 42 and the fourth sealing side surface 46. The external electrode portion 72DE includes a protrusion 72DA. Thus, it can be said that the protrusion 72DA is exposed from the sealing back surface 42. As shown in FIG. 12, the external electrode portion 72DE is disposed to connect multiple protrusions 72DA. The flange 72DF is disposed to have an area that increases from a terminal surface 72DB (referring to FIG. 11) of the drain terminal 72D. The flange 72DF extends in the Y direction from the Y direction of the external electrode portion 72DE toward two ends. Consequently, the two ends of the flange 72DF in the Y direction are exposed from the first sealing side surface 43 and the second sealing side surface 44. Moreover, the flange 72DF extends from the external electrode portion 72DE toward the third sealing side surface 45. As shown in FIG. 13, the sealing resin 40 fills a portion closer to the sealing back surface 42 than the flange 72DF.

As shown in FIG. 11, the gate terminal 72G is disposed in a corner portion in the sealing resin 40 that is closer to the second sealing side surface 44 and the third sealing side surface 45. The gate terminal 72G includes an external electrode portion 72GE and a flange 72GF. In an example, the external electrode portion 72GE and the flange 72GF are formed integrally. The external electrode portion 72GE is exposed from the sealing back surface 42 and the second sealing side surface 44. The flange 72GF extends in the Y direction from the Y direction of the external electrode portion 72GE toward two ends. The flange 72GF is exposed from the third sealing side surface 45. In an example, as shown in FIG. 12, the length of the flange 72GF extending in the Y direction from the external electrode portion 72GE toward the second sealing side surface 44 is greater than the length of the flange 72GF extending from the external electrode portion 72GE toward the first sealing side surface 43. The sealing resin 40 fills a portion closer to the sealing back surface 42 than the flange 72GF.

As shown in FIG. 11, the source terminal 72S includes two source terminals namely a source terminal 72SP and a source terminal 72SQ. In a plan view, the source terminal 72SP and the source terminal 72SQ are located at the same position in the X direction, and are spaced from each other in the Y direction. The source terminal 72SP is positioned closer to the gate terminal 72G than the source terminal 72SQ.

As shown in FIG. 12, the source terminal 72SP includes an external electrode portion 72SE and a flange 72SF. In an example, the external electrode portion 72SE and the flange 72SF are formed integrally. The external electrode portion 72SE is exposed from the sealing back surface 42 and the first sealing side surface 43. The flange 72SF extends in the Y direction from the Y direction of the external electrode portion 72SE toward two ends. The sealing resin 40 fills a portion closer to the sealing back surface 42 than the flange 72SF.

As shown in FIG. 11, the length of the source terminal 72SQ in the Y direction is greater than the length of the source terminal 72SP in the Y direction. The source terminal 72SQ includes multiple (two in the third embodiment) protrusions 72SA. The multiple protrusions 72SA are spaced from each other in the Y direction. The multiple protrusions 72SA are exposed from the third sealing side surface 45.

As shown in FIG. 12 and FIG. 13, the source terminal 72SQ includes an external electrode portion 72SE and a flange 72SF. In an example, the external electrode portion 72SE and the flange 72SF of the source terminal 72SQ are formed integrally. The external electrode portion 72SE is exposed from the sealing back surface 42 and the third sealing side surface 45. The external electrode portion 72SE includes multiple protrusions 72SA. As shown in FIG. 12, the external electrode portion 72SE is disposed to connect multiple protrusions 72SA. The flange 72SF is disposed to have an area that increases from a terminal surface 72SB (referring to FIG. 11) of the source terminal 72SQ. The flange 72SF extends in the Y direction from the Y direction of the external electrode portion 72SE toward two ends. Consequently, one of the two ends of the flange 72SF in the Y direction that is close to the first sealing side surface 43 is exposed from the first sealing side surface 43. Moreover, the flange 72SF extends from the external electrode portion 72SE toward the fourth sealing side surface 46. The sealing resin 40 fills a portion closer to the sealing back surface 42 than the flange 72SF.

The die pad 71 is disposed between the gate terminal 72G as well as the source terminal 72S and the drain terminal 72D in the X direction in a plan view. The die pad 71 is disposed to be closer to the gate terminal 72G and the source terminal 72S than the drain terminal 72D in the X direction. That is to say, a distance between the die pad 71 and the gate terminal 72G as well as the source terminal 72S in the X direction is less than a distance between the die pad 71 and the drain terminal 72D in the X direction.

The die pad 71 is formed as a rectangular tablet having the Z direction as a thickness direction. The die pad 71 extends in the Y direction throughout most of the sealing resin 40. In a plan view, the die pad 71 is formed as rectangular in shape, wherein the Y direction is the length direction and the X direction is the width direction (short-side direction). Each of two ends of the die pad 71 in the Y direction is provided with multiple (four in the third embodiment) protrusions 71A. In a plan view, each of the protrusions 71A extends in the Y direction. In a plan view, each of the multiple protrusions 71A disposed at one of the two ends of the die pad 71 in the Y direction that is close to the first sealing side surface 43 is exposed from the first sealing side surface 43. Each of the multiple protrusions 71A disposed at one of the two ends of the die pad 71 in the Y direction that is close to the second sealing side surface 44 is exposed from the second sealing side surface 44.

As shown in FIG. 12, the die pad 71 includes an external electrode portion 71E and a flange 71F. In an example, the external electrode portion 71E and the flange 71F are formed integrally. The external electrode portion 71E is exposed from the sealing back surface 42. The external electrode portion 71E is formed as rectangular in shape, wherein the Y direction is the length direction and the X direction is the width direction (short-side direction). The flange 71F is disposed to have an area that increases from a die pad surface 71B (referring to FIG. 11) of the die pad 71. The flange 71F extends in the X direction from the X direction of the external electrode portion 71E toward two ends. The length of the flange 71F extending from the external electrode portion 71E toward the second sealing side surface 44 is greater than the length of the flange 71F extending from the external electrode portion 71E toward the first sealing side surface 43. As shown in FIG. 13, the sealing resin 40 fills each of a portion closer to the sealing back surface 42 than the flange 71F and a portion closer to the sealing back surface 42 than each of the protrusions 71A.

The semiconductor element 20 is mounted on the die pad 71. More specifically, the semiconductor element 20 is bonded to the die pad 71 by a bonding material SD. The configuration of the semiconductor element 20 is the same as the configuration of the semiconductor element 20 of the first embodiment. On the other hand, configuration forms of the multiple drain pads 21D, the multiple source pads 21S and the gate pad 21G formed on the element front surface 21 of the semiconductor element 20 are different from those of the first embodiment.

More specifically, similar to the first embodiment, the multiple drain pads 21D and the multiple source pads 21S are alternately arranged in the Y direction. The multiple drain pads 21D and the multiple source pads 21S are arranged from the first element side surface 23 toward the second element side surface 24 in an order of the drain pad 21D (21DE), the source pad 21S, the drain pad 21D, the source pad 21S, the drain pad 21D and the source pad 21S (21SE). Herein, in the third embodiment, the first end 21A of the element front surface 21 forms the end of the element front surface 21 close to the second element side surface 24, and the second end 21B forms the end of the element front surface 21 close to the first element side surface 23. Thus, the multiple drain pads 21D and the multiple source pads 21S are arranged from the first end 21A toward the second end 21B in an order of the source pad 21S (21SE), the drain pad 21D, the source pad 21S, the drain pad 21D, the source pad 21S and the drain pad 21D (21DE). Moreover, the shapes and the sizes of the drain pads 21D (21DE) and the source pads 21S are the same as the shapes and the sizes of the drain pads 21D (21DE) and the source pads 21S of the first embodiment. Similar to the first embodiment, the source pad 21SE includes the recess 21SA. The recess 21SA is formed to cut a corner portion of the source pad 21SE close to the second element side surface 24 and the third element side surface 25. The gate pad 21G is disposed in the region RA surrounded by the first end 21A (second element side surface 24), the recess 21SA and the third element side surface 25 in a plan view.

Figure 14:
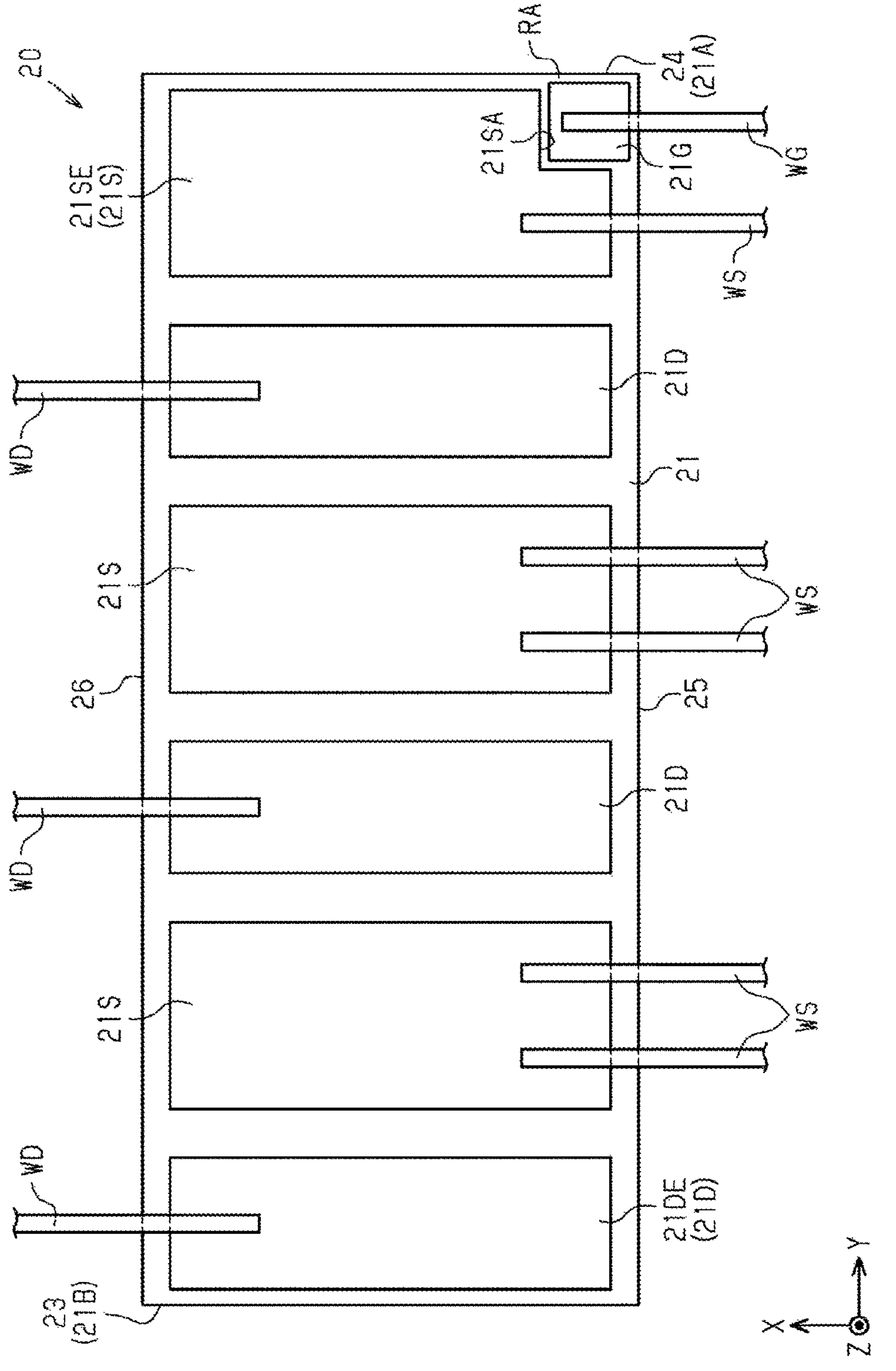
FIG. 14 is a plan view of a connection structure of the switching element of the third embodiment with a drain wiring, a source wiring and a gate wiring.

As shown in FIG. 11 and FIG. 14, the semiconductor device 10 of the third embodiment includes a gate conductive wire WG as a gate wiring, a source conductive wire WS as a source wiring, and a drain conductive wire WD as a drain wiring. Each of the gate conductive wire WG, the source conductive wire WS and the drain conductive wire WD is formed of, for example, gold (Au), silver (Ag), aluminum (Al) or copper (Cu). In the third embodiment, each of the gate conductive wire WG, the source conductive wire WS and the drain conductive wire WD is a bonding wire, and has a wire diameter same as that of another.

Moreover, the wire diameter of the gate conductive wire WG can be less than the wire diameters of both the source conductive wire WS and the drain conductive wire WD.

The gate conductive wire WG connects the gate pad 21G and the gate terminal 72G of the semiconductor element 20. In an example, a bonding portion of the gate conductive wire WG with the gate pad 21G is a first bonding portion, and that with the gate terminal 72G is a second bonding portion.

The drain conductive wire WD connects the multiple drain pads 21D and the drain terminal 72D of the semiconductor element 20. The drain conductive wire WD corresponds to the number of the multiple drain pads 21D and are provided in plural. In the third embodiment, the number of the drain pads 21D is three, and so there are three drain conductive wires WD. In an example, a bonding portion of each of the drain conductive wires WD with the drain pads 21D is a first bonding portion, and that with the drain terminal 72D is a second bonding portion.

The source conductive wire WS connects the source pad 21S and the source terminal 72S of the semiconductor element 20. One source conductive wire WS is bonded at the source pad 21SE. The one source conductive wire WS is bonded to the source terminal 72SP. In an example, a bonding portion of the one source conductive wire WS with the source pad 21SE is a first bonding portion, and that with the source terminal 72SP is a second bonding portion.

As shown in FIG. 14, multiple (two in the third embodiment) source conductive wires WS are bonded to the multiple source pads 21S other than the source pad 21SE. Herein, the width of the multiple source pads 21S is greater than the width of the drain pad 21D, and so can be bonded by multiple source conductive wires WS. The multiple source conductive wires WS are bonded to the source terminal 72SQ (referring to FIG. 11). In an example, a bonding portion of the multiple source conductive wires WS with the source pad 21S is a first bonding portion, and that with the source terminal 72SQ is a second bonding portion.

As such, the total number of the source conductive wires WS is greater than the total number of the drain conductive wires WD. Thus, a total (first source connection area) of a connection area of the source conductive wires WS and the source pad 21S is greater than a total (first drain connection area) of a connection area of the drain conductive wires WD and the drain pad 21D. In addition, a total (second source connection area) of a connection area of the source conductive wires WS and the source terminals 72SP and 72SQ is greater than a total (second drain connection area) of a connection area of the drain conductive wires WD and the drain terminal 72D. Thus, a source connection area which is a total of the first source connection area and the second source connection area is greater than a drain connection area which is a total of the first drain connection area and the second drain connection area. In other words, the connection area of the source wiring (multiple source conductive wires WS) is greater than the connection area of the drain wiring (multiple drain conductive wires WD).

Moreover, a bonding portion of the gate conductive wire WG with the gate terminal 72G can be a first bonding portion, and that with the gate pad 21G can be a second bonding portion. Moreover, a bonding portion of the drain conductive wire WD with the drain terminal 72D can be a first bonding portion, and that with the drain pad 21D can be a second bonding portion. Moreover, a bonding portion of the source conductive wire WS with the source terminals 72SP and 72SQ can be a first bonding portion, and that with the source pads 21S and 21SE can be a second bonding portion.

Effects

The semiconductor device 10 according to the third embodiment achieves the following effects.

(3-1) The source wiring 30S includes multiple source conductive wires WS. The drain wiring 30D includes multiple drain conductive wires WD. In a configuration where the connection area of the source wiring 30S is greater than the connection area of the drain wiring 30D, the number of the source conductive wires WS is greater than the number of the drain conductive wires WD.

According to the configuration above, the parasitic inductance between the source terminals 50S and the source pads 21S connected to the source wiring 30S can be reduced. Thus, switching performance of the semiconductor device 10 can be enhanced.

Fourth Embodiment

Figure 15:
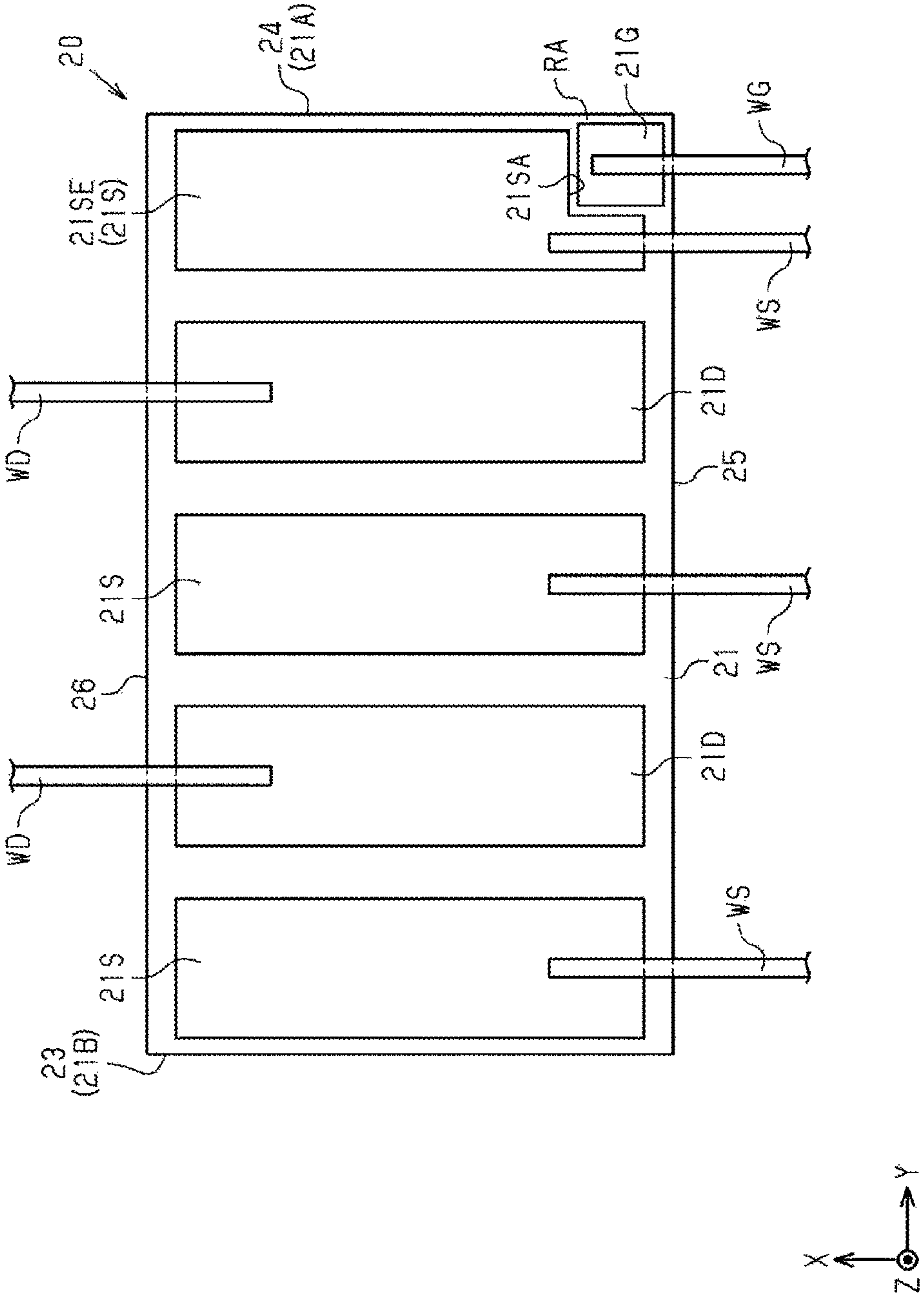
FIG. 15 is a plan view of a connection structure of the switching element of a semiconductor device of a fourth embodiment with a drain wiring, a source wiring and a gate wiring.

Referring to FIG. 15, a semiconductor device 10 according to the fourth embodiment is described below. Compared to the semiconductor device 10 of the third embodiment, the semiconductor device 10 of the fourth embodiment primarily differs in the respect of the configurations of the source pads 21S and the drain pads 21D. In the description below, aspects different from those of the third embodiment are described, and constituting elements common with those of the third embodiment are represented by the same numerals and symbols and associated details thereof are omitted for brevity.

As shown in FIG. 15, the semiconductor device 10 of the fourth embodiment includes the semiconductor element 20 of the second embodiment. Thus, in the semiconductor element 20 of the fourth embodiment, the number (three in the fourth embodiment) of the source pads 21S is greater than the number (two in the fourth embodiment) of the drain pads 21D. Moreover, in the fourth embodiment, the area of each of the multiple source pads 21S other than the source pad 21SE is greater than the area of each of the multiple drain pads 21D. Accordingly, the source area which is the total area of the multiple source pads 21S is greater than the drain area which is the total area of the multiple drain pads 21D.

Similar to the third embodiment, the semiconductor device 10 of the fourth embodiment includes a gate conductive wire WG as a gate wiring, a source conductive wire WS as a source wiring, and a drain conductive wire WD as a drain wiring. In the fourth embodiment, each of the gate conductive wire WG, the source conductive wire WS and the drain conductive wire WD is a bonding wire, and has a wire diameter same as that of another. Moreover, the wire diameter of the gate conductive wire WG can be less than the wire diameters of both the source conductive wire WS and the drain conductive wire WD.

The source conductive wire WS is connected to each of the multiple source pads 21S. The drain conductive wire WD is connected to each of the multiple drain pads 21D. The number of the source pads 21S is greater than the number of the drain pads 21D, and so the number of the source conductive wires WS is greater than the number of the drain conductive wires WD. Thus, the connection area of the source wiring (multiple source conductive wires WS) is greater than the connection area of the drain wiring (multiple drain conductive wires WD). Moreover, the semiconductor device 10 according to the fourth embodiment achieves the same effects as those of the third embodiment.

Fifth Embodiment

Figure 16:
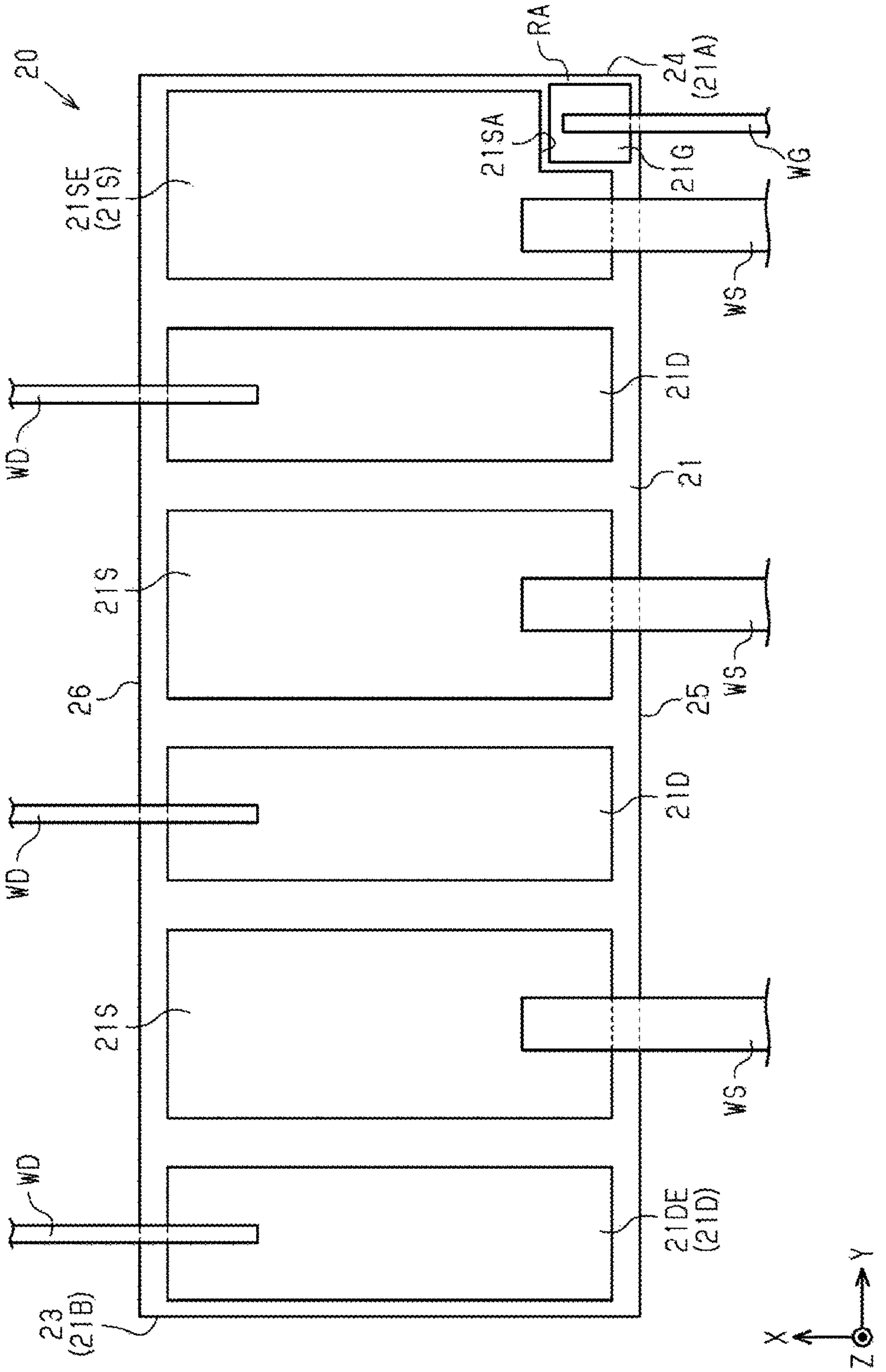
FIG. 16 is a plan view of a connection structure of the switching element of a semiconductor device of a fifth embodiment with a drain wiring, a source wiring and a gate wiring.

Referring to FIG. 16, a semiconductor device 10 according to the fifth embodiment is described below. Compared to the semiconductor device 10 of the third embodiment, the semiconductor device 10 of the fifth embodiment primarily differs in the respect of the configuration of the source conductive wires WS. In the description below, aspects different from those of the third embodiment are described, and constituting elements common with those of the third embodiment are represented by the same numerals and symbols and associated details thereof are omitted for brevity.

As shown in FIG. 16, similar to the third embodiment, the semiconductor device 10 of the fifth embodiment includes a gate conductive wire WG as a gate wiring, a source conductive wire WS as a source wiring, and a drain conductive wire WD as a drain wiring. In the fifth embodiment, each of the gate conductive wire WG, the source conductive wire WS and the drain conductive wire WD is a bonding wire. Moreover, the wire diameter of the source conductive wire WS is greater than the wire diameter of each of the gate conductive wire WG and the drain conductive wire WD.

The source conductive wire WS is connected to each of the multiple source pads 21S. The drain conductive wire WD is connected to each of the multiple drain pads 21D. Herein, the number of the source pads 21S is the same as the number of the drain pads 21D. On the other hand, the wire diameter of the source conductive wire WS is greater than the wire diameter of the drain conductive wire WD. That is to say, a connection area of the source conductive wire WS relative to the source pad 21S is greater than a connection area of the drain conductive wire WD relative to the drain pad 21D. In addition, although not shown, a connection area of the source conductive wire WS relative to the source terminal 72S is similarly greater than a connection area of the drain conductive wire WD relative to the drain terminal 72D. Thus, the connection area using the source wiring (multiple source conductive wires WS) is greater than the connection area using the drain wiring (multiple drain conductive wires WD).

Moreover, the relation between the number of the source conductive wires WS and the number of the drain conductive wires WD can be modified as desired. In an example, the number of the source conductive wires WS can be greater than the number of the drain conductive wires WD.

Effects

The semiconductor device 10 according to the fifth embodiment achieves the following effects.

(5-1) In a configuration where the connection area of the source wiring 30S is greater than the connection area of the drain wiring 30D, the number of the source conductive wires WS is greater than the number of the drain conductive wires WD, and the wire diameter of the source conductive wires WS is greater than the wire diameter of the drain conductive wires WD.

According to the configuration above, the parasitic inductance between the source terminals 50S and the source pads 21S connected to the source wiring 30S can be reduced. Thus, switching performance of the semiconductor device 10 can be enhanced.

Sixth Embodiment

Figure 17:
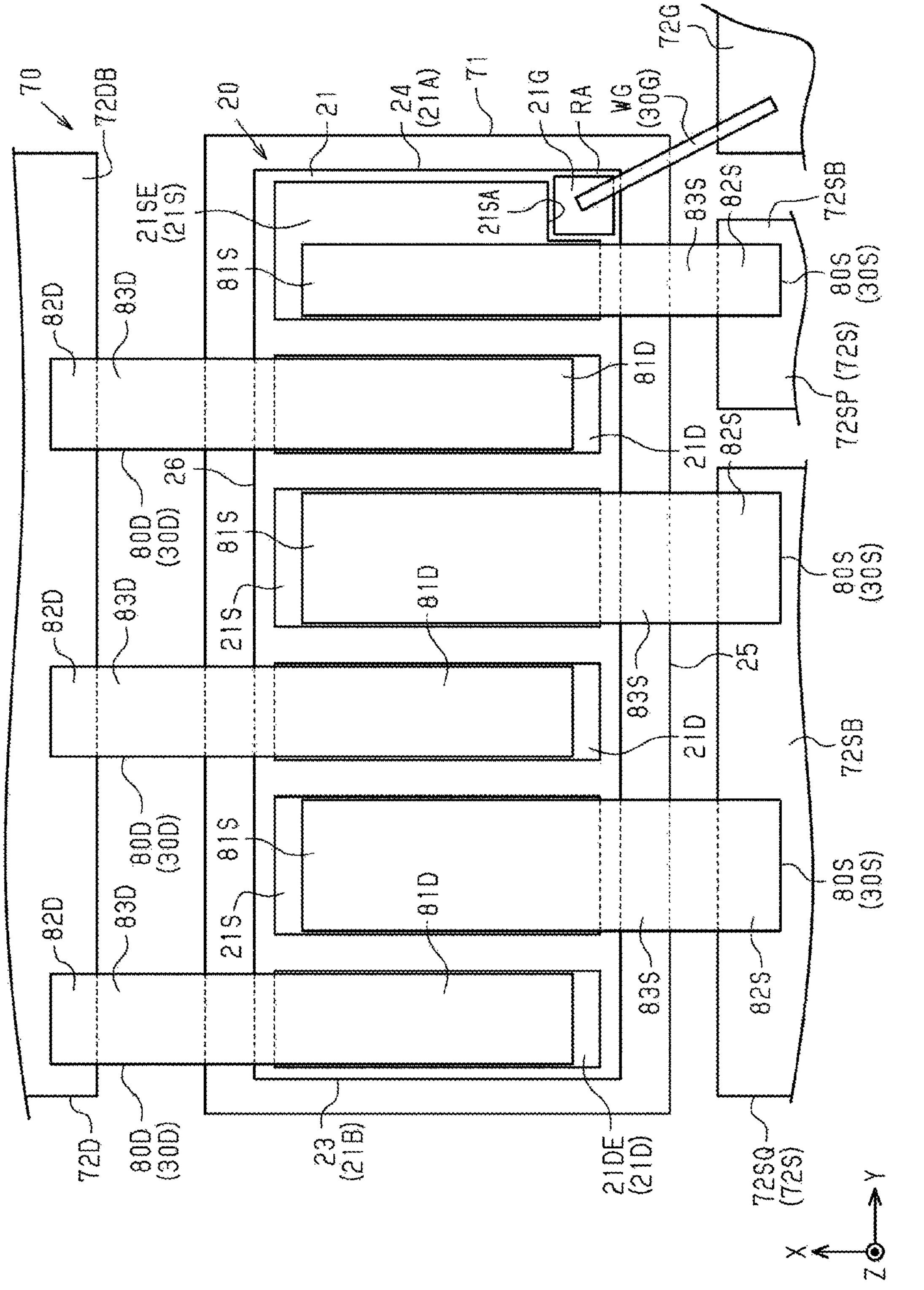
FIG. 17 is a plan view of a connection structure of the switching element of a semiconductor device of a sixth embodiment with a drain fixture, a source fixture and a gate wiring.
Figure 18:
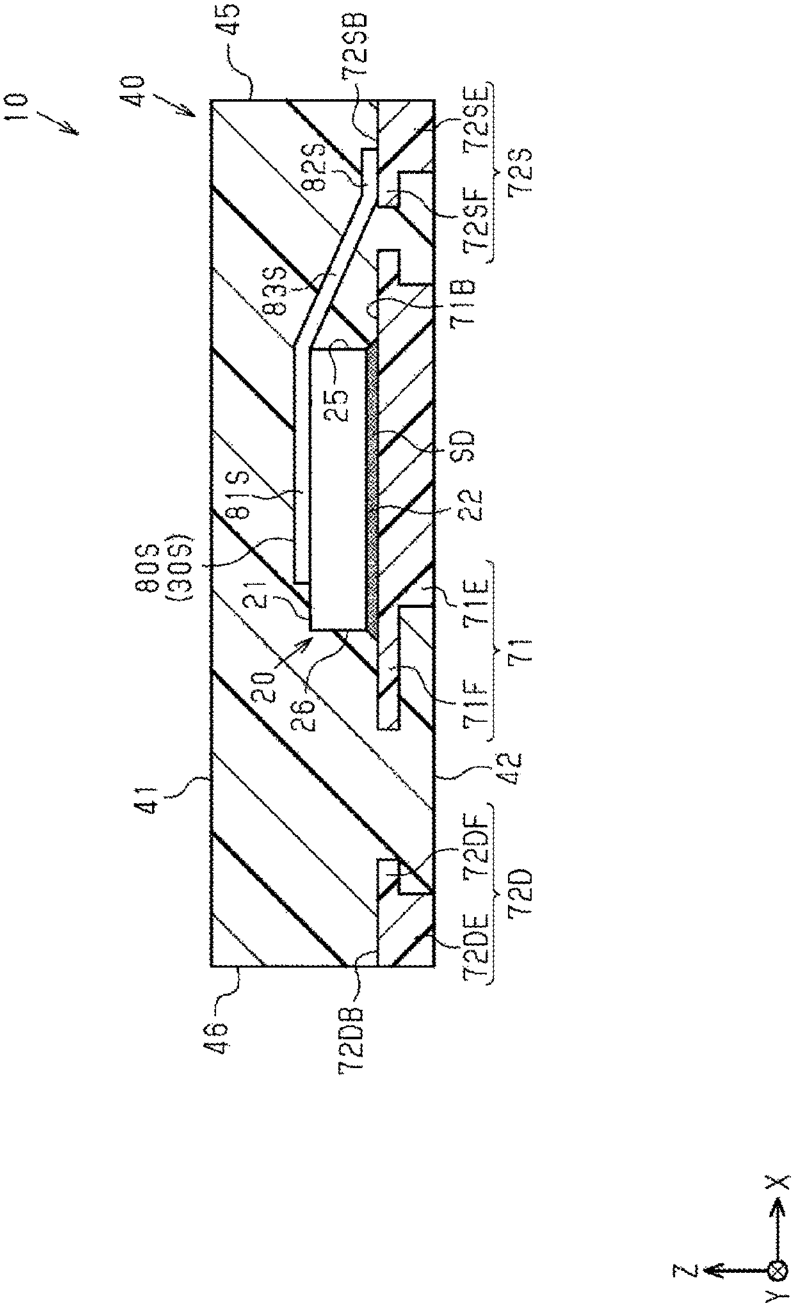
FIG. 18 is a schematic cross-sectional diagram of a semiconductor device of the sixth embodiment.
Figure 19:
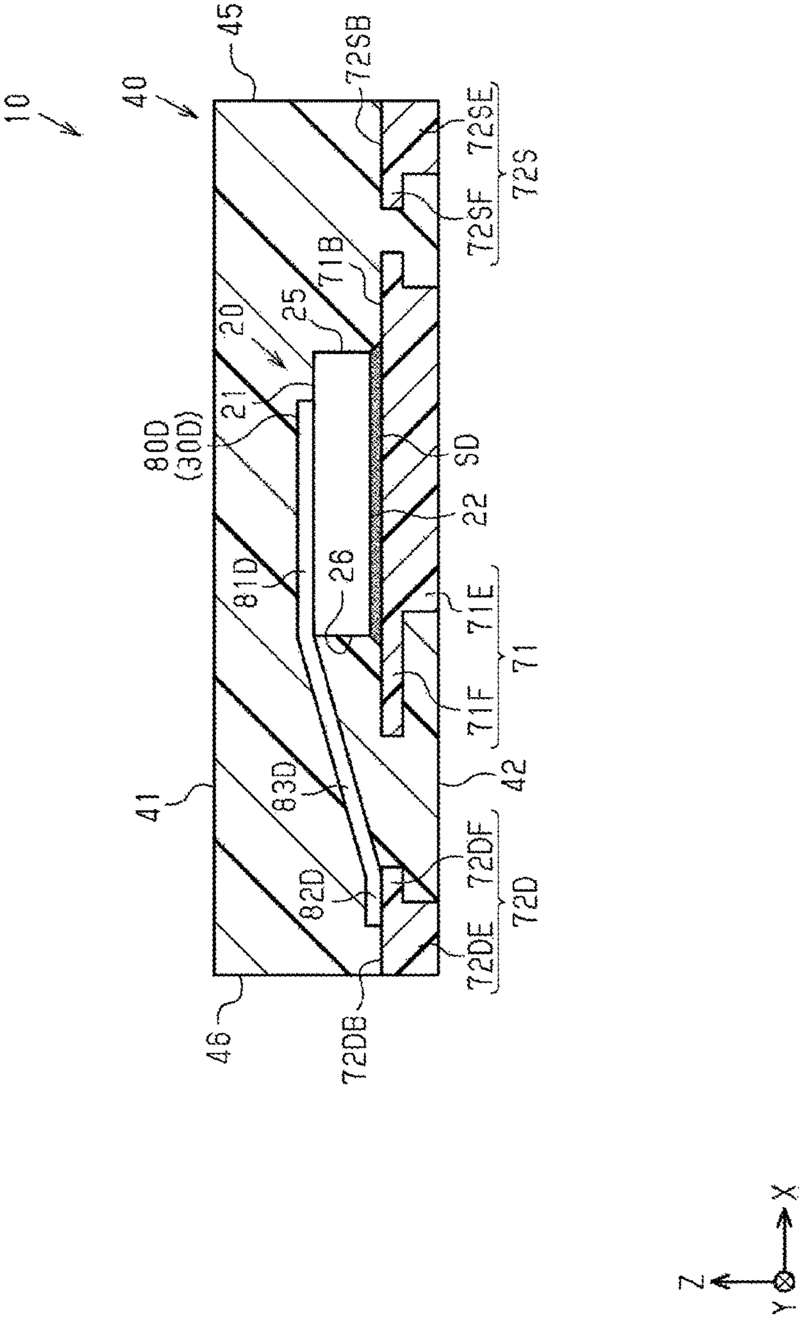
FIG. 19 is a schematic cross-sectional diagram of a semiconductor device of the sixth embodiment.

Referring to FIG. 17 to FIG. 19, a semiconductor device 10 according to the sixth embodiment is described below. Compared to the semiconductor device 10 of the first embodiment, the semiconductor device 10 of the sixth embodiment primarily differs in the respect of the configurations of the source wiring 30S and the drain wiring 30D. In the description below, details different from those of the first embodiment are described, and constituting elements common with those of the first embodiment are represented by the same numerals and symbols and associated details thereof are omitted for brevity.

As shown in FIG. 17 to FIG. 19, in the semiconductor device 10 of the sixth embodiment, the source wiring 30S is formed by a source fixture 80S, which is formed of a thin metal sheet. The drain wiring 30D is formed by a drain fixture 80D, which is formed of a thin metal sheet.

The source fixture 80S corresponds to the number of the multiple source pads 21S and is provided as plural in number. In the sixth embodiment, there are three source pads 21S, and so three source fixtures 80S are provided. The multiple source fixtures 80S are spaced from each other in the Y direction.

Among the multiple source fixtures 80S, in the source fixture 80S separately connected to the multiple source pads 21S and the source fixture 80S connected to the source pad 21SE, the widths of the source fixtures 80S are different. The width of the source fixture 80S connected to the source pad 21SE is less than the width of the source fixture 80S connected to the source pad 21S. Moreover, the configuration of the source fixture 80S connected to the source pad 21SE is the same as the configuration of the source fixture 80S connected to the source pad 21S. In the description of the source fixture 80S below, the configuration of the source fixture 80S connected to the source pad 21S is described, and the configuration of the source fixture 80S connected to the source pad 21SE is omitted.

As shown in FIG. 17, in a plan view, the source fixture 80S is formed as a strip shape extending in the X direction. The source fixture 80S includes a source pad connection portion 81S connected to the source pad 21S, a source terminal connection portion 82S connected to the source terminal 72S (72SQ), and a source connection portion 83S connecting the source pad connection portion 81S and the source terminal connection portion 82S. In an example, the source pad connection portion 81S, the source terminal connection portion 82S and the source connection portion 83S are formed integrally. The source fixture 80S is formed by, for example, bending processing.

The source pad connection portion 81S is connected to the source pad 21S. The source pad connection portion 81S is bonded to the source pad 21S by, for example, ultrasonic waves. Moreover, the bonding method for the source pad connection portion 81S and the source pad 21S can be modified as desired. In an example, the source pad connection portion 81S can also be bonded to the source pad 21S by a conductive bonding material such as solder paste.

In a plan view, the source pad connection portion 81S is formed as rectangular in shape, wherein the X direction is the length direction and the Y direction is the width direction (short-side direction). The width of the source pad connection portion 81S is substantially same as the width of the source pad 21S.

The source terminal connection portion 82S is connected to the terminal surface 72SB of the source terminal 72S. The source terminal connection portion 82S is bonded to the terminal surface 72SB of the source terminal 72S by, for example, ultrasonic waves. Moreover, the bonding method for the source terminal connection portion 82S and the source terminal 72S can be modified as desired. In an example, the source terminal connection portion 82S can also be bonded to the source terminal 72S by a conductive bonding material such as solder paste.

In a plan view, the source terminal connection portion 82S is formed as rectangular in shape, wherein the Y direction is the length direction and the X direction is the width direction (short-side direction). The length of the source terminal connection portion 82S in the X direction is less than the length of the source pad connection portion 81S in the X direction. Moreover, the source terminal connection portion 82S of the source fixture 80S connected to the source pad 21SE is formed as rectangular in shape in a plan view, wherein the X direction is the length direction and the Y direction is the short-side direction.

As shown in FIG. 18, the source connection portion 83S is positioned closer to the source terminal 72S than the semiconductor element 20. The source connection portion 83S inclines to approach the sealing back surface 42 from the source pad connection portion 81S toward the source terminal connection portion 82S.

The drain fixture 80D corresponds to the number of the multiple drain pads 21D and is provided as plural in number. In the sixth embodiment, there are three drain pads 21D, and so three drain fixtures 80D are provided. The multiple drain fixtures 80D are spaced from each other in the Y direction. Moreover, the multiple drain pads 21D and the multiple source pads 21S are alternately arranged in the Y direction, and so the multiple drain fixtures 80D and the multiple source fixtures 80S are alternately arranged in the Y direction.

As shown in FIG. 17, in a plan view, the drain fixture 80D is formed as a strip shape extending in the X direction. The drain fixture 80D includes a drain pad connection portion 81D connected to the drain pad 21D, a drain terminal connection portion 82D connected to the drain terminal 72D, and a drain connection portion 83D connecting the drain pad connection portion 81D and the drain terminal connection portion 82D. In an example, the drain pad connection portion 81D, the drain terminal connection portion 82D and the drain connection portion 83D are formed integrally.

The drain pad connection portion 81D is connected to the drain pad 21D. The drain pad connection portion 81D is bonded to the drain pad 21D by, for example, ultrasonic waves. Moreover, the bonding method for the drain pad connection portion 81D and the drain pad 21D can be modified as desired. In an example, the drain pad connection portion 81D can also be bonded to the drain pad 21D by a conductive bonding material such as solder paste.

In a plan view, the drain pad connection portion 81D is formed as rectangular in shape, wherein the X direction is the length direction and the Y direction is the width direction (short-side direction). The width of the drain pad connection portion 81D is substantially same as the width of the drain pad 21D.

The drain terminal connection portion 82D is connected to the terminal surface 72DB of the drain terminal 72D. The drain terminal connection portion 82D is bonded to the terminal surface 72DB of the drain terminal 72D by, for example, ultrasonic waves. Moreover, the bonding method for the drain terminal connection portion 82D and the drain terminal 72D can be modified as desired. In an example, the drain terminal connection portion 82D can also be bonded to the drain terminal 72D by a conductive bonding material such as solder paste.

In a plan view, the drain terminal connection portion 82D is formed as rectangular in shape, wherein the Y direction is the length direction and the X direction is the width direction (short-side direction). The length of the drain terminal connection portion 82D in the X direction is less than the length of the drain pad connection portion 81D in the X direction.

As shown in FIG. 19, the drain connection portion 83D is positioned closer to the drain terminal 72D than the semiconductor element 20. The drain connection portion 83D inclines to approach the sealing back surface 42 from the drain pad connection portion 81D toward the drain terminal connection portion 82D.

In the sixth embodiment, the length of the drain pad connection portion 81D in the length direction (X direction) is equal to the length of the source pad connection portion 81S in the length direction (X direction). On the other hand, since the width of the drain pad 21D is less than the width of the source pad 21S, the width of the drain pad connection portion 81D is less than the width of the source pad connection portion 81S. Thus, in a plan view, the area of one drain pad connection portion 81D is less than the area of one source pad connection portion 81S. In other words, in a plan view, the area of one source pad connection portion 81S is greater than the area of one drain pad connection portion 81D. Thus, in the sixth embodiment, the connection area of one drain pad 21D and one drain pad connection portion 81D is less than the connection area of one source pad 21S and one source pad connection portion 81S. In other words, the connection area of one source pad 21S and one source pad connection portion 81S is greater than the connection area of one drain pad 21D and one drain pad connection portion 81D. On the other hand, the width of the source pad connection portion 81S of the source fixture 80S connected to the source pad 21SE is less than the width of the drain pad connection portion 81D. Accordingly, in a plan view, the area of the source pad connection portion 81S of the source fixture 80S connected to the source pad 21SE is less than the area of the drain pad connection portion 81D. Thus, the connection area of the source pad connection portion 81S of the source fixture 80S connected to the source pad 21SE and the source pad 21SE is less than the connection area of one drain pad 21D and one drain pad connection portion 81D. However, even by taking into consideration the situation above, in the sixth embodiment, a total of the connection area of the source pad 21S and the source pad connection portion 81S is still greater than a total of the connection area of the drain pad 21D and the drain pad connection portion 81D.

On the other hand, the length of the drain terminal connection portion 82D in the X direction is the same as the length of the source terminal connection portion 82S in the X direction. On the other hand, the length (width) of the drain terminal connection portion 82D in the Y direction is less than the length (width) of the source terminal connection portion 82S in the Y direction. In other words, the length (width) of the source terminal connection portion 82S in the Y direction is greater than the length (width) of the drain terminal connection portion 82D in the Y direction. Accordingly, in a plan view, the area of one source pad connection portion 81S is greater than the area of one drain pad connection portion 81D. Thus, in the sixth embodiment, the connection area of one drain pad 21D and one drain pad connection portion 81D is less than the connection area of one source pad 21S and one source pad connection portion 81S. In other words, the connection area of one source pad 21S and one source pad connection portion 81S is greater than the connection area of one drain pad 21D and one drain pad connection portion 81D. On the other hand, the length (width), in the Y direction, of the source terminal connection portion 82S of the source fixture 80S connected to the source terminal 72SP is less than the length (width) of the drain terminal connection portion 82D in the Y direction. Accordingly, in a plan view, the area of the source terminal connection portion 82S of the source fixture 80S connected to the source terminal 72SP is less than the area of the drain pad connection portion 81D. Thus, the connection area of the source terminal connection portion 82S of the source fixture 80S connected to the source terminal 72SP and the source terminal 72SP is less than the connection area of one drain pad 21D and one drain pad connection portion 81D. However, even by taking into consideration the situation above, in the sixth embodiment, in a plan view, a total of the connection area of the drain terminal 72D and the drain terminal connection portion 82D is still greater than a total of the connection area of the source terminals 72SP and 72SQ and the source terminal connection portion 82S. As such, it can be said that the connection area of the source wiring 30S (source fixture 80S) is greater than the connection area of the drain wiring 30D (drain fixture 80D).

Effects

The semiconductor device 10 according to the sixth embodiment achieves the following effects.

(6-1) The area of each of the multiple source pads 21S is greater than the area of each of the multiple drain pads 21D. The source wiring 30S is formed by the source fixture 80S. The drain wiring 30D is formed by the drain fixture 80D. The source fixture 80S is connected to the source pad 21S, and the drain fixture 80D is connected to the drain pad 21D.

According to the configuration above, the total of the connection area of the source fixture 80S connected to the multiple source pads 21S and the source pads 21S is greater than the total of the connection area of the drain fixture 80D connected to the multiple drain pads 21D and the drain pads 21D. Thus, the parasitic inductance between the source terminal 50S connected to the source wiring 30S and the source pad 21S can be reduced.

Moreover, since the source fixture 80S is connected to both the source pad 21S and the source terminal 72S, from the perspective of comparing with a configuration of electrically connecting the source pad 21S and the source terminal 72S by a source conductive wire, the connection areas with respect to both of the source pad 21S and the source terminal 72S can be easily increased.

Variation Examples

The embodiments above can be modified as follows and be accordingly implemented. Moreover, the embodiments described above and the variation examples below can be implemented in combination, given that they are not technically contradictory.

Figure 20:
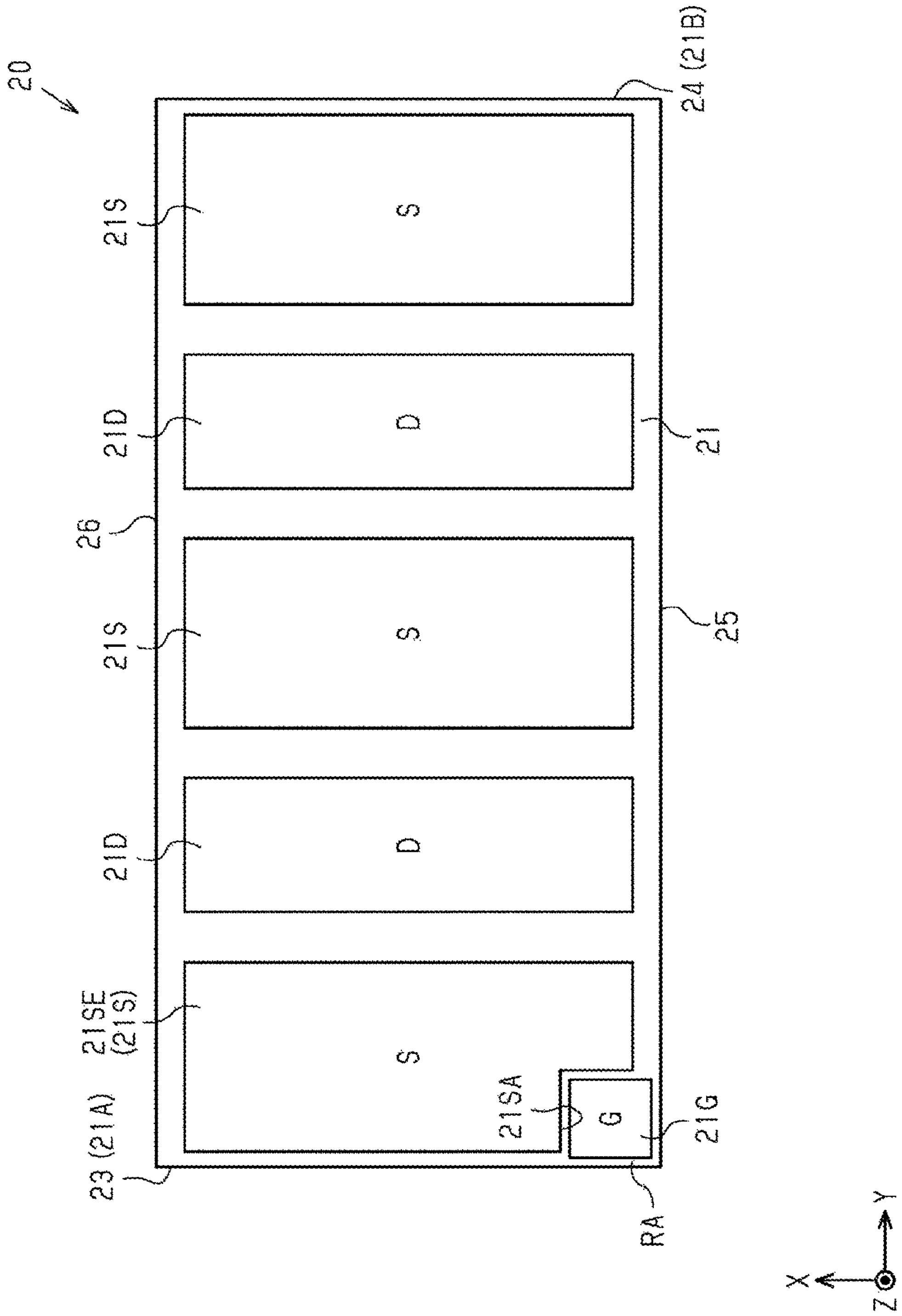
FIG. 20 is a plan view of a switching element of a variation example.

In the second and fourth embodiments, the relation between the area of the drain pad 21D of the semiconductor element 20 and the area of the source pad 21S can be modified as desired. In an example, as shown in FIG. 20, the width of each of the source pads 21S can also be greater than the width of the drain pad 21D as that in the first embodiment. In an example, at least one of the width of the source pad 21S and the width of the drain pad 21D is modified by having a ratio of the source area to the drain area to be between a range of 5/3 and 2.

Figure 21:
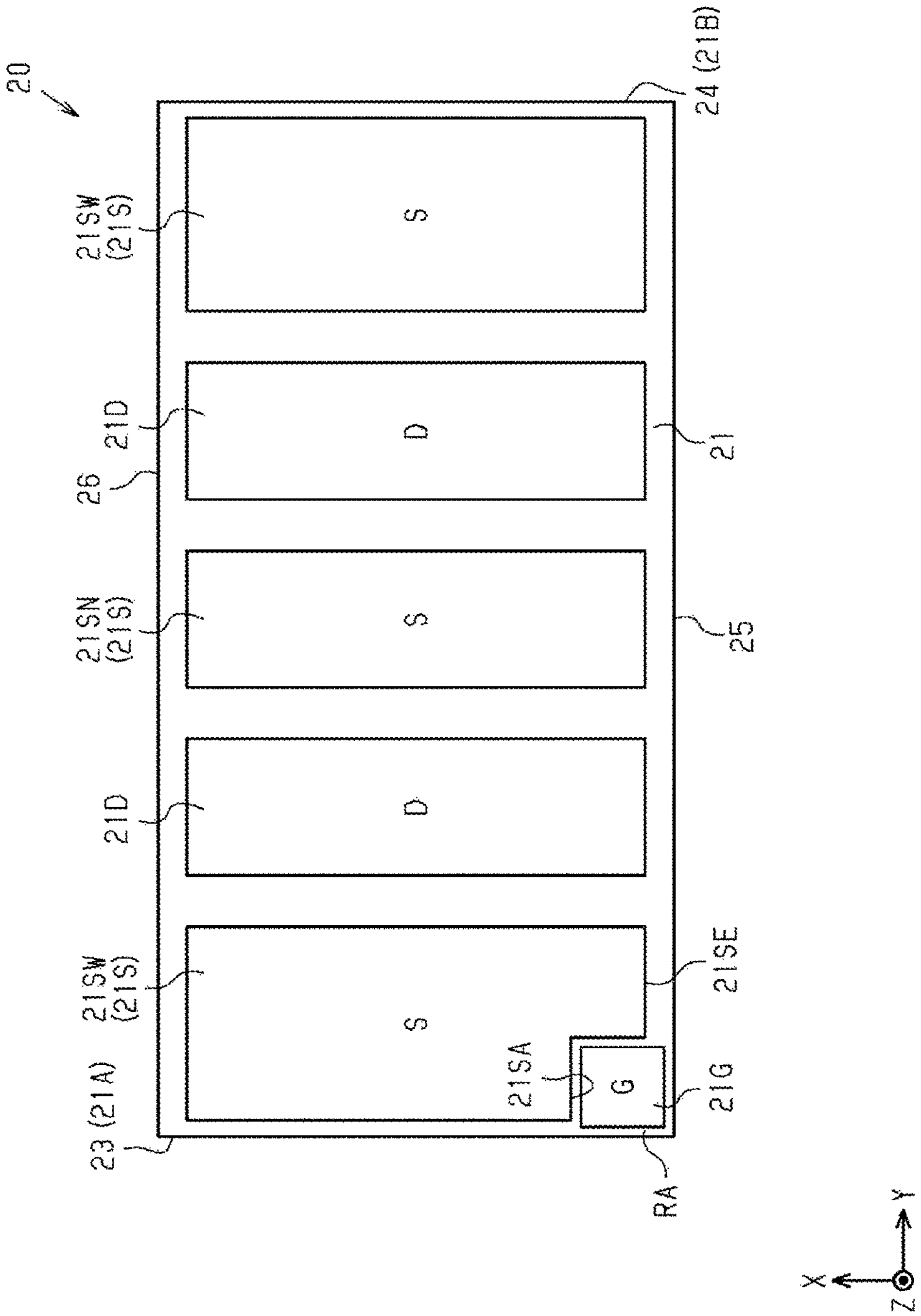
FIG. 21 is a plan view of a switching element of a variation example.

Moreover, in an example, as shown in FIG. 21, the source pad 21S can also include a narrow source pad 21SN in which the width of the source pad 21S is equal to the width of the drain pad 21D, and a wide source pad 21SW in which the width of the source pad 21S is greater than the width of the drain pad 21D.

For example, in a case where the source wiring portion 34 is connected to the source pad 21S, the width of the source tooth portion 34A corresponding to the wide source pad 21SW is greater than the width of the source tooth portion 34A corresponding to the narrow source pad 21SN.

For example, in a case where the source conductive wire WS is connected to the source pad 21S, the number of the source conductive wires WS connected to the wide source pad 21SW is greater than the number of the source conductive wires WS connected to the narrow source pad 21SN.

In the various embodiments, the arrangement patterns of the multiple drain pads 21D and the multiple source pads 21S can be modified as desired. In an example, in an arrangement direction of the multiple drain pads 21D and the multiple source pads 21S, the multiple source pads 21S can also be arranged to be adjacent in the arrangement direction thereof.

In the various embodiments, the shape of each of the drain pads 21D and the source pads 21S of the semiconductor element 20 in a plan view can be modified as desired. In an example, the shape of the drain pad 21D in a plan view can be an elongated circle with two curved ends in the length direction, or can be an ellipsoid. Moreover, the shape of the source pads 21S in a plan view can be an elongated circle with two curved ends in the length direction, or can be an ellipsoid.

In the various embodiments, the position of the gate pad 21G on the element front surface 21 of the semiconductor element 20 can be modified as desired.

Figure 22:
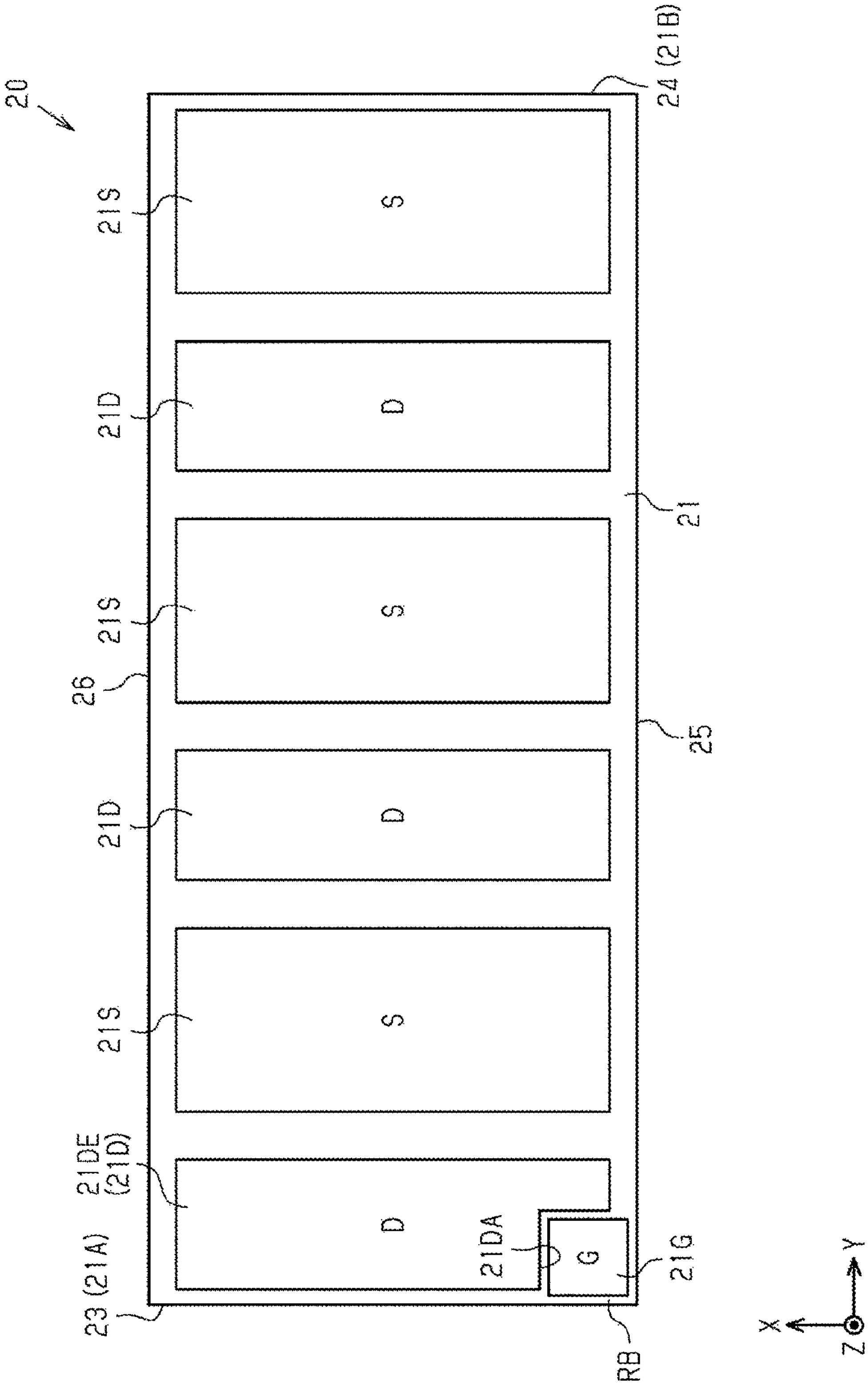
FIG. 22 is a plan view of a switching element of a variation example.

In a first example, as shown in FIG. 22, the multiple source pads 21S and the multiple drain pads 21D are arranged from the first end 21A toward the second end 21B in an order of the drain pad 21D, the source pad 21S, the drain pad 21D, the source pad 21S, the drain pad 21D and the source pad 21S. Thus, it can be said that the drain pad 21D is disposed at the first end 21A. The drain pad 21D disposed at the first end 21A corresponds to an "end pad". In the description below, sometimes the drain pad 21D corresponding to the end pad is referred to as a "drain pad 21DE".

The drain pad 21DE includes a recess 21DA which is formed in a corner portion located close to the first end 21A of the element front surface 21. Herein, in the variation example shown in FIG. 22, the corner portion located close to the first end 21A of the element front surface 21 is a corner portion among four corners of the element front surface 21 that is close to the first element side surface 23 and the third element side surface 25.

On the element front surface 21, the gate pad 21G is arranged in a region RB formed by the recess 21DA and disposed in the corner portion. The region RB is a region surrounded by the recess 21DA, the first element side surface 23 and the third element side surface 25 in a plan view.

Figure 23:
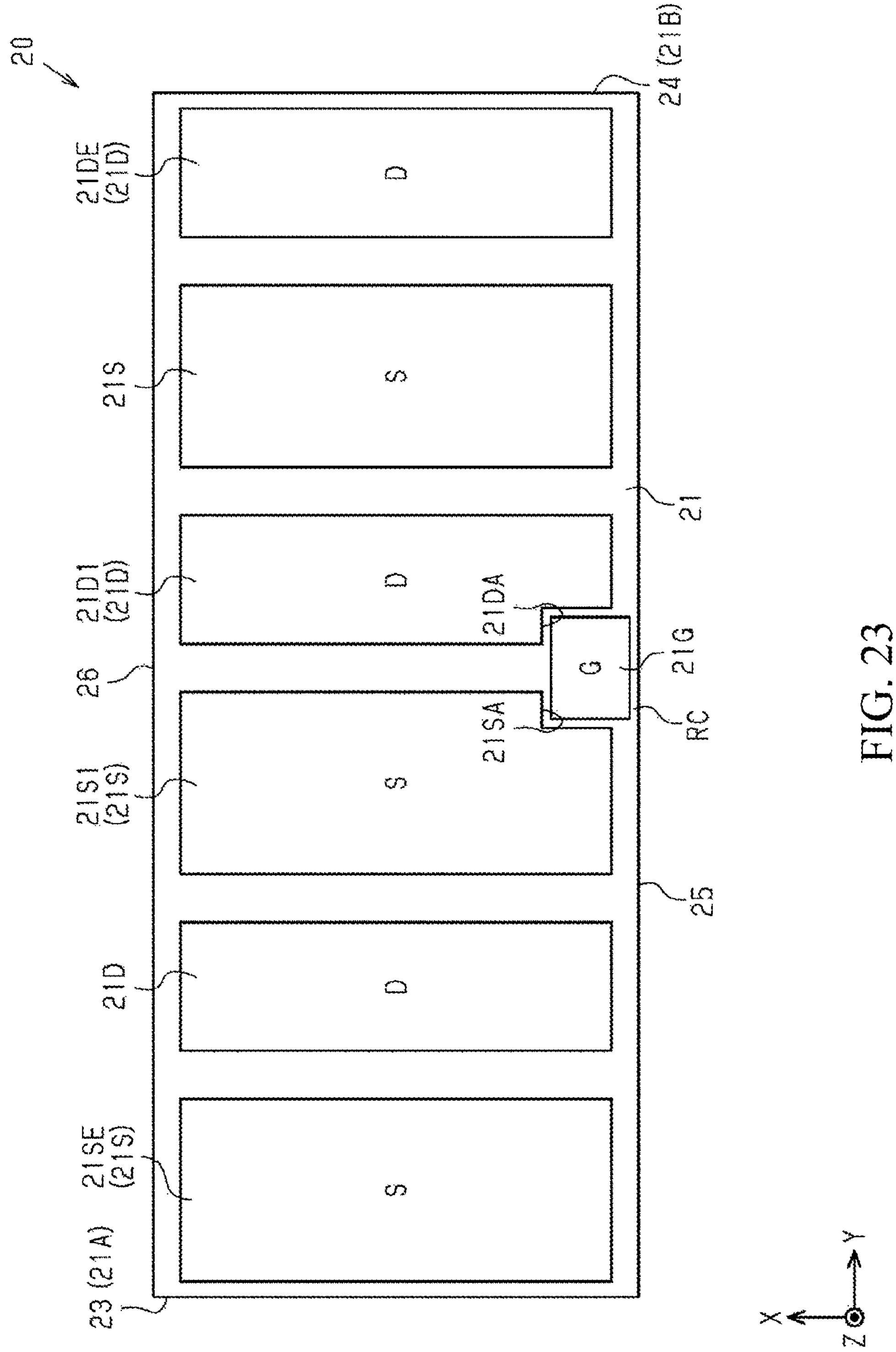
FIG. 23 is a plan view of a switching element of a variation example.

In a second example, the gate pad 21G can also be arranged at a position other than the corner portion among the four corners forming the element front surface 21. As shown in FIG. 23, at least one of a first source pad 2151 among the multiple source pads 21S and a first drain pad 21D1 adjacent to the first source pad 2151 in the Y direction has a recess. In the example shown in FIG. 23, the first source pad 21S1 has the recess 21SA, and the first drain pad 21D1 has the recess 21DA. The recess 21SA is formed to cut a corner portion of the first source pad 21S1 that is close to the third element side surface 25 and the first drain pad 21D1. The recess 21DA is formed to cut a corner portion of the first drain pad 21D1 that is close to the third element side surface 25 and the first source pad 21S1.

The gate pad 21G is arranged in the recesses 21SA, 21DA. More specifically, the gate pad 21G is arranged in a region RC surrounded by the recess 21SA, the recess 21DA and the third element side surface 25 in a plan view.

In the various embodiments, a distance between the source pad 21S disposed near the first end 21A of the element front surface 21 of the semiconductor element 20 and the first end 21A in the Y direction can also be greater than the width of the drain pad 21D. Moreover, a distance between the source pad 21S disposed near the first end 21A of the element front surface 21 and the first end 21A in the Y direction can also be greater than the width of the source pad 21S.

Figure 24:
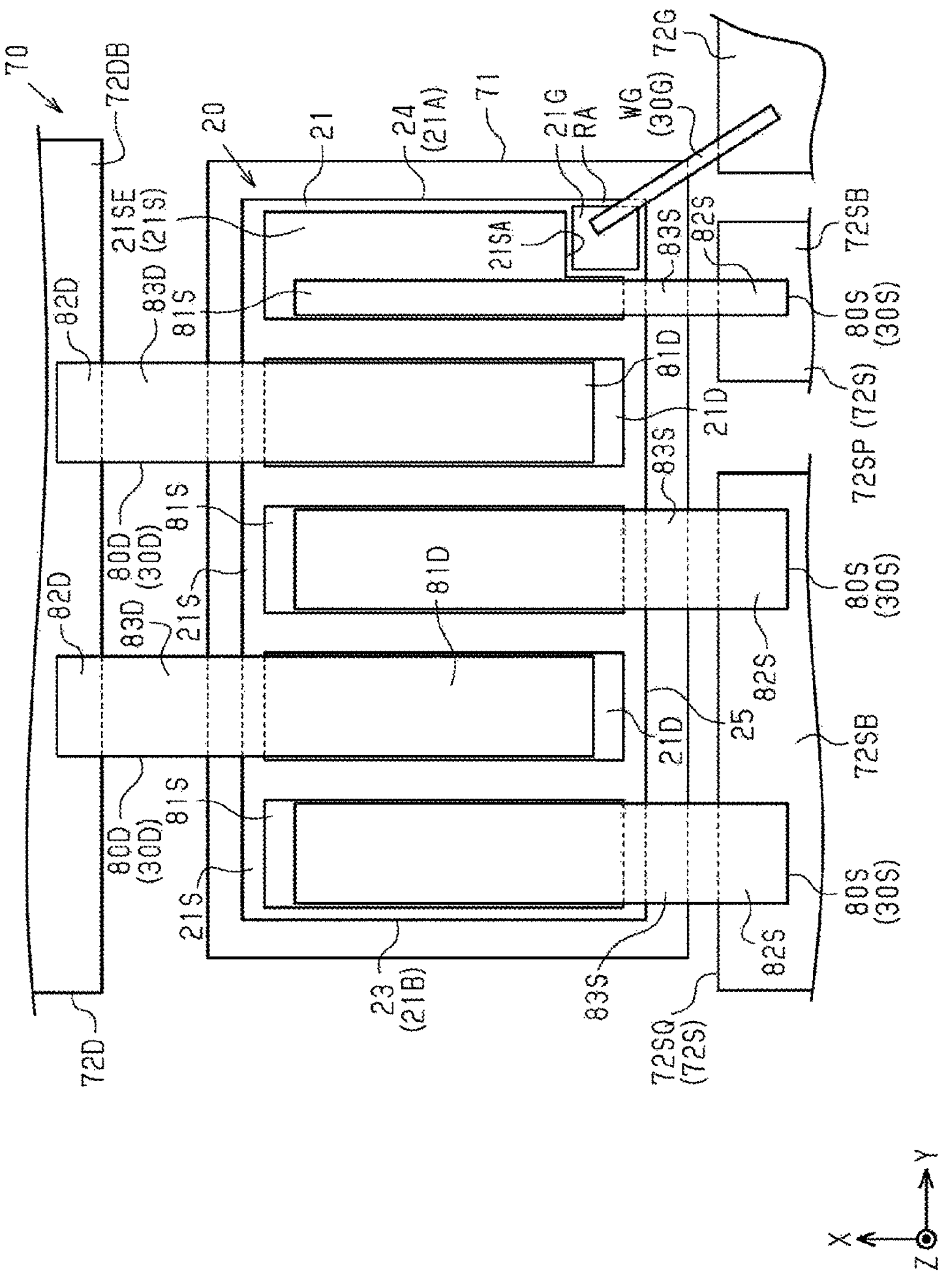
FIG. 24 is a plan view of a position relation of the switching element of a semiconductor device related to a variation example with a drain fixture, a source fixture and a gate wiring.

In the sixth embodiment, the semiconductor element 20 of the second embodiment can also be used as the semiconductor element 20. In this case, as shown in FIG. 24, the number of the source fixture 80S corresponds to the number of the multiple source pads 21S, and so the number of the multiple source fixtures 80S of the variation example can be the same as the number of the multiple source fixtures 80S of the sixth embodiment. The width of the source pad connection portion 81S of the source fixture 80S connected to the source pad 21SE is less than the width of the source pad connection portion 81S of the source fixture 80S connected to the other source pads 21S.

The number of the drain fixture 80D corresponds to the number of the multiple drain pads 21D, and so the number of the multiple drain fixtures 80D of the variation example is less than the number of the multiple drain fixtures 80D of the sixth embodiment. Thus, the number of the multiple drain fixtures 80D is less than the number of the multiple source fixtures 80S.

As described above, the respective numbers of the multiple source pads 21S and the multiple source fixtures 80S are greater than the respective numbers of the multiple drain pads 21D and the multiple drain fixtures 80D, and so the connection area of the source wiring 30S is greater than the connection area of the drain wiring 30D.

In the variation example in FIG. 24, the width of each of the source pads 21S can also be greater than the width of the drain pad 21D as described in the sixth embodiment. In an example, at least one of the width of the source pad 21S and the width of the drain pad 21D is modified by having a ratio of the source area to the drain area to be between a range of 5/3 and 2. The width of the source fixture 80S can correspond to the width of the source pad 21S and is thus increased.

In the sixth embodiment, the shape of the source fixture 80S in a plan view can be modified as desired. In an example, the source fixture 80S can also be formed such that the width of the source connection portion 83S gradually increases from the source pad connection portion 81S toward the source terminal connection portion 82S. In this case, the width (size in the Y direction) of the source terminal connection portion 82S is greater than the width (size in the Y direction) of the source pad connection portion 81S.

In the sixth embodiment, the shape of the drain fixture 80D in a plan view can be modified as desired. In an example, the drain fixture 80D can also be formed such that the width of the drain connection portion 83D gradually increases from the drain pad connection pad 81D toward the drain terminal connection portion 82D. In this case, the width (size in the Y direction) of the drain terminal connection portion 82D is greater than the width (size in the Y direction) of the drain pad connection portion 81D.

In the sixth embodiment, the shape of the source fixture 80S viewed from the Y direction can be modified as desired. In an example, the source connection portion 83S can also be formed as an L shape when viewing from the Y direction. That is to say, the source connection portion 83S includes a first portion extending continuously from the source pad connection portion 81S in the X direction, a second portion extending and curving from the source terminal connection portion 82S in the Z direction, and a curve portion connecting the first portion and the second portion.

In the sixth embodiment, the shape of the drain fixture 80D viewed from the Y direction can be modified as desired. In an example, the drain connection portion 83D can also be formed as an L shape when viewing from the Y direction. That is to say, the drain connection portion 83D includes a first portion extending continuously from the drain pad connection portion 81D in the X direction, a second portion extending and curving from the drain terminal connection portion 82D in the Z direction, and a curve portion connecting the first portion and the second portion.

Figure 25:
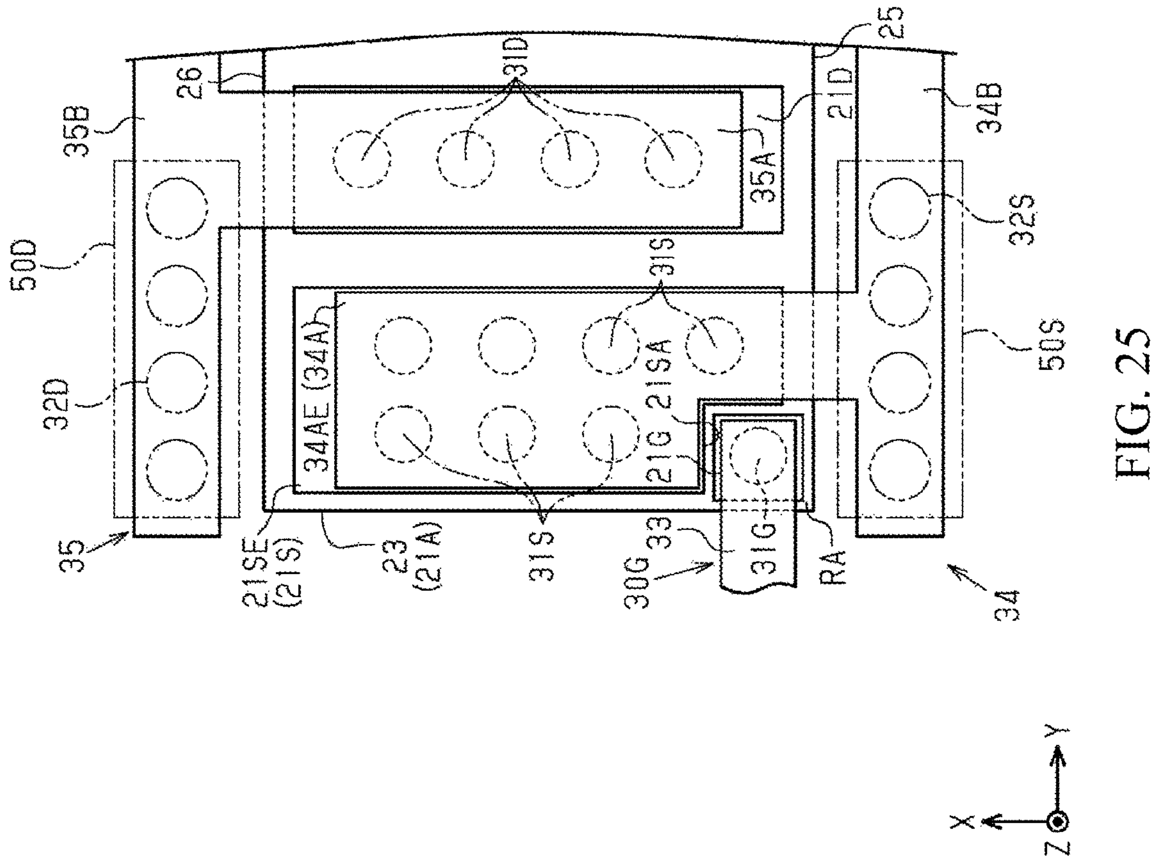
FIG. 25 is a plan view of a partial position relation of the switching element of a semiconductor device related to a variation example with a drain wiring, a source wiring and a gate wiring.

In the first and second embodiments, the shape of the source wiring portion 34 corresponding to the source pad 21SE in a plan view can be modified as desired. In an example, as shown in FIG. 25, the source tooth portion 34AE includes a wide portion having a width same as the width of another source tooth portion 34AE, and a narrow portion having a width less than the width of another source tooth portion 34AE. The narrow portion is connected to the source connection portion 34B. Accordingly, the number of the first through vias 31S connecting the source tooth portion 34AE and the source pad 21SE can be increased. Moreover, in the sixth embodiment, similarly, the configuration of the source fixture 80S corresponding to the source pad 21SE can be modified as desired. That is to say, the source fixture 80S connected to the source pad 21SE includes a wide portion having a width same as the width of another source fixture 80S, and a narrow portion having a width less than the width of another source fixture 80S.

The terms such as "on" used in the present disclosure also includes meanings of "over" and "above", unless otherwise specified in the context. Thus, the expression "A formed on/over B" refers to that A is in contact with B and is directly arranged on B in the various embodiments, but also refers to that A is not in contact with the B and is arranged above B in some variation examples. That is to say, the expression "on" does not eliminate a structure having another component formed between A and B.

The Z direction used in the present disclosure is not necessarily a vertical direction, and is not necessarily completely consistent with the vertical direction. Thus, various structures associated with the present disclosure do not limit "up/top" and "down/bottom" of the Z direction given in the description to be "up" and "down" of the vertical direction. For example, the X direction can also be the vertical direction, or the Y direction can also be the vertical direction.

<Notes>

The technical concepts that are conceivable based on the embodiments and the variation examples are recited in the description below. Moreover, for better understanding without being intended for limiting, the configurations described in the notes are represented in the parentheses to indicate the corresponding numerals and symbols in the embodiments. The numerals or symbols are used for better understanding purposes, and the constituting elements denoted with the numerals or symbols are not limited to the constituting elements indicated by the numerals or symbols.

[Note 1]

A switching element (20), comprising:

an element front surface (21) on which a gate pad (21G), a plurality of drain pads (21D) and a plurality of source pads (21S) are formed, wherein a source area which is a total area of the plurality of source pads (21S) is greater than a drain area which is a total area of the plurality of drain pads (21D).

[Note 2]

The switching element of Note 1, wherein a ratio of the source area to the drain area is between 5/3 and 2.

[Note 3]

The switching element of Note 1 or 2, wherein both the plurality of source pads (21S) and the plurality of drain pads (21D) are alternately arranged in a first direction (Y direction) along the element front surface (21).

[Note 4]

The switching element of Note 3, wherein an area of each of the plurality of source pads (21S) is greater than an area of each of the plurality of drain pads (21D).

[Note 5]

The switching element of Note 4, wherein the plurality of source pads (21S) are formed to have the same size, and the plurality of drain pads (21D) are formed to have the same size.

[Note 6]

The switching element of Note 4 or 5, wherein in the first direction (Y direction), a width of the plurality of source pads (21S) is greater than a width of the plurality of drain pads (21D).

[Note 7]

The switching element of any one of Notes 3 to 5, wherein a width of the plurality of source pads (21S) and a width of the plurality of drain pads (21D) are same, and a number of the plurality of source pads (21S) is greater than a number of the plurality of drain pads (21D).

[Note 8]

The switching element of any one of Notes 3 to 7, wherein when viewing from a direction (Z direction) perpendicular to the element front surface (21), each of the plurality of source pads (21S) and the plurality of drain pads (21D) has a rectangular shape with a width direction as the first direction (Y direction) and a length direction as a second direction (X direction) along the element front surface (21) and orthogonal to the first direction (Y direction).

[Note 9]

The switching element of any one of Notes 3 to 8, wherein one of the plurality of source pads (21S) and the plurality of drain pads (21D) includes an end pad (21SE) disposed near a first end (21A) of the element front surface (21) in the first direction (Y direction), the end pad (21SE) includes a recess (21SA) formed in a corner portion located close to the first end (21A), and the gate pad (21G) is arranged in a region (RA) formed by the recess (21SA) and disposed in the corner portion.

[Note 10]

The switching element of any one of Notes 3 to 8, wherein at least one of a first source pad (21S1) among the plurality of source pads (21S) and a first drain pad (21D1) adjacent to the first source pad (21S1) in the first direction (Y direction) has a recess (21SA, 21DA), and the gate pad (21G) is arranged in the recess (21SA, 21DA).

[Note 11]

The switching element of any one of Notes 3 to 8, wherein one of the plurality of source pads (21S) and the plurality of drain pads (21D) includes an end pad (21SE) disposed near a first end (21A) of the element front surface (21) in the first direction (Y direction), a distance between the first end (21A) of the element front surface (21) on which the end pad (21SE) is disposed and the end pad (21SE) in the first direction (Y direction) is less than a width of each of the plurality of source pads (21S) and the plurality of drain pads (21D).

[Note 12]

The switching element of any one of Notes 1 to 11, wherein the switching element (20) is a GaN HEMT.

[Note 13]

A semiconductor device (10), comprising:

the switching element (20) of any one of Notes 1 to 12;

a sealing resin (40) sealing the switching element (20); and a gate terminal (50G), a source terminal (50S) and a drain terminal (50D) exposed from the sealing resin (40).

[Note 14]

The semiconductor device of Note 13, further comprising:

a gate wiring (30G) connecting the gate pad (21G) and the gate terminal (50G);

a source wiring (30S) connecting the plurality of source pads (21S) and the source terminal (50S); and a drain wiring (30D) connecting the plurality of drain pads (21D) and the drain terminal (50D), wherein a connection area of the source wiring (30S) is greater than a connection area of the drain wiring (30D).

[Note 15]

The semiconductor device of Note 14, wherein the source wiring (30S) comprises a source fixture (80S) connecting the source pad (21S) and the source terminal (72S); the drain wiring (30D) comprises a drain fixture (80D) connecting the drain pad (21D) and the drain terminal (72D); in a configuration where the connection area of the source wiring (30S) is greater than the connection area of the drain wiring (30D), a connection area of the source fixture (80S) is greater than a connection area of the drain fixture (80D).

[Note 16]

The semiconductor device of Note 15, wherein the source fixture (80S) comprises a source pad connection portion (81S) connected to the source pad (21S), the drain fixture (80D) comprises a drain pad connection portion (81D) connected to the drain pad (21D), and in a configuration where the connection area of the source fixture (80S) is greater than the connection area of the drain fixture (80D), a width of the source pad connection pad (81S) is greater than a width of the drain pad connection portion (81D).

[Note 17]

The semiconductor device of Note 15, wherein in a configuration where the connection area of the source fixture (80S) is greater than the connection area of the drain fixture (80D), a number of the source fixture (80S) is greater than a number of the drain fixture (80D).

[Note 18]

The semiconductor device of Note 14, wherein the source wiring (30S) comprises:

a plurality of first source through vias (31S) connected to each of the plurality of source pads (21S);

a plurality of second source through vias (32S) connected to the source terminal (50S); and a source wiring portion (34) connecting the plurality of first source through vias (31S) and the plurality of second source through vias (32S); and the drain wiring (30D) comprises:

a plurality of first drain through vias (31D) connected to each of the plurality of drain pads (21D);

a plurality of second drain through vias (32D) connected to the drain terminal (50D); and a drain wiring portion (35) connecting the plurality of first drain through vias (31D) and the plurality of second drain through vias (32D).

[Note 19]

The semiconductor device of Note 18, wherein in a configuration where the connection area of the source wiring (30S) is greater than the connection area of the drain wiring (30D), a total number of the plurality of first source through vias (31S) and the plurality of second source through vias (32S) is greater than a total number of the plurality of first drain through vias (31D) and the plurality of second drain through vias (32D).

[Note 20]

The semiconductor device of Note 14, wherein the source wiring (30S) comprises a plurality of source conductive wires (WS), and the drain wiring (30D) comprises a plurality of drain conductive wires (WD).

[Note 21]

The semiconductor device of Note 20, wherein in a configuration where the connection area of the source wiring (30S) is greater than the connection area of the drain wiring (30D), a wire diameter of the source conductive wire (WS) is the same as a wire diameter of the drain conductive wire (WD), and a number of the source conductive wire (WS) is greater than a number of the drain conductive wire (WD).

[Note 22]

The semiconductor device of Note 20, wherein in a configuration where the connection area of the source wiring (30S) is greater than the connection area of the drain wiring (30D), a wire diameter of the source conductive wire (WS) is greater than a wire diameter of the drain conductive wire (WD), and a number of the source conductive wire (WS) is the same as a number of the drain conductive wire (WD).

It should be noted that the description above is merely simple examples. It can be conceivable to the industrialist that, apart from the constituting elements and methods (manufacturing processes) enumerated for the technical objective of the present disclosure, there are many other conceivable combinations and substitutions. The present disclosure is intended to encompass all substitutions, modifications and variations covered by the scope of claims of the present disclosure.

The invention claimed is:

1. A switching element, comprising:

an element front surface on which a gate pad, a plurality of drain pads, and a plurality of source pads are formed, wherein a source area which is a total area of the plurality of source pads is greater than a drain area which is a total area of the plurality of drain pads, the plurality of source pads and the plurality of drain pads are alternately arranged in a first direction along the element front surface, at least one of the plurality of source pads or one of the plurality of drain pads includes a specific pad having a recess that is formed in any one corner portion among four corners of the specific pad, the gate pad is arranged in a region formed by the recess and disposed at the corner portion, and an area of the specific pad having the recess is less than an area of each of other pads among the plurality of source pads or the plurality of drain pads to which the specific pad belongs.

2. The switching element of claim 1, wherein, when viewing from a direction perpendicular to the element front surface, each of the plurality of source pads, excluding the specific pad, and the plurality of drain pads, excluding the specific pad, has a rectangular shape with a width direction as the first direction and a length direction as a second direction along the element front surface and orthogonal to the first direction.

3. The switching element of claim 1, wherein the specific pad includes an end pad disposed near a first end of the element front surface in the first direction, the end pad includes the recess formed in a corner portion located close to the first end.

4. The switching element of claim 1, wherein the specific pad includes an end pad disposed near a first end of the element front surface in the first direction, and a distance between the first end of the element front surface on which the end pad is disposed and the end pad in the first direction is less than a width of each of the plurality of source pads and the plurality of drain pads.

5. The switching element of claim 1, wherein the switching element is a GaN HEMT.

6. The switching element of claim 1, wherein a ratio of the source area to the drain area is between 5/3 and 2.

7. A semiconductor device, comprising:

the switching element of claim 6;

a sealing resin sealing the switching element; and a gate terminal, a source terminal and a drain terminal exposed from the sealing resin.

8. The switching element of claim 1, wherein the specific pad is at least one of a first source pad among the plurality of source pads and a first drain pad adjacent to the first source pad in the first direction.

9. The switching element of claim 8, wherein the specific pad includes both the first source pad and the first drain pad, the first source pad includes a first recess, the first drain pad includes a second recess, and the gate pad is arranged in a region formed by both the first recess of the first source pad and the second recess of the first drain pad.

10. A semiconductor device, comprising:

the switching element of claim 1;

a sealing resin sealing the switching element; and a gate terminal, a source terminal and a drain terminal exposed from the sealing resin.

11. The semiconductor device of claim 10, further comprising:

a gate wiring connecting the gate pad and the gate terminal;

a source wiring connecting the plurality of source pads and the source terminal; and a drain wiring connecting the plurality of drain pads and the drain terminal, wherein a connection area of the source wiring is greater than a connection area of the drain wiring.

12. The switching element of claim 1, wherein an area of each of the plurality of source pads is greater than an area of each of the plurality of drain pads.

13. The switching element of claim 12, wherein in the first direction, a width of the plurality of source pads, excluding the specific pad, is greater than a width of the plurality of drain pads, excluding the specific pad.

14. The switching element of claim 12, wherein the plurality of source pads, excluding the specific pad, are formed to have same size, and the plurality of drain pads, excluding the specific pad, are formed to have same size.

15. The switching element of claim 14, wherein a width of the plurality of source pads, excluding the specific pad, and a width of the plurality of drain pads are same, and a number of the plurality of source pads, excluding the specific pad, is greater than a number of the plurality of drain pads.

* * * * *